US008557691B2

(12) United States Patent
Sun et al.

(10) Patent No.: US 8,557,691 B2
(45) Date of Patent: Oct. 15, 2013

(54) METHOD OF FABRICATING SEMICONDUCTOR DEVICE HAVING BURIED WIRING AND RELATED DEVICE

(75) Inventors: Min-Chul Sun, Seoul (KR); Byung-Gook Park, Seoul (KR)

(73) Assignees: Samsung Electronics Co., Ltd., Gyeonggi-Do (KR); SNU R&DB Foundation, Seoul (KR)

( * ) Notice: Subject to any disclaimer, the term of this patent is extended or adjusted under 35 U.S.C. 154(b) by 0 days.

(21) Appl. No.: 13/550,814

(22) Filed: Jul. 17, 2012

(65) Prior Publication Data
US 2013/0178048 A1 Jul. 11, 2013

(30) Foreign Application Priority Data
Jan. 10, 2012 (KR) .................. 10-2012-0003147

(51) Int. Cl.
*H01L 21/425* (2006.01)
(52) U.S. Cl.
USPC ............ 438/526; 257/E21.246; 257/E21.537; 438/370; 438/422; 438/619; 438/735; 438/738; 438/924
(58) Field of Classification Search
USPC ........... 257/E21.246, E21.537; 438/370, 422, 438/526, 619, 735, 738, 924
See application file for complete search history.

(56) References Cited

U.S. PATENT DOCUMENTS

| | | | |
|---|---|---|---|
| 5,236,872 A * | 8/1993 | van Ommen et al. ......... | 438/659 |
| 5,621,239 A | 4/1997 | Horie et al. | |
| 7,268,065 B2 * | 9/2007 | Lin et al. ...................... | 438/510 |
| 7,456,071 B2 | 11/2008 | Marty et al. | |
| 7,670,896 B2 | 3/2010 | Zhu et al. | |
| 2011/0084320 A1 * | 4/2011 | Jung .............................. | 257/288 |
| 2011/0108928 A1 * | 5/2011 | Tao et al. ...................... | 257/410 |
| 2012/0193719 A1 * | 8/2012 | Or-Bach et al. ............... | 257/368 |
| 2013/0001576 A1 * | 1/2013 | Jung .............................. | 257/66 |

OTHER PUBLICATIONS

Erokhin et al., "Spatially Confined Nickel Disilicide Formation at 400 °C on Ion Implantation Preamorphized Silicon," Appl. Phys. Lett., vol. 63, No. 23, Dec. 6, 1993, pp. 3173-3175.
Lim et al., "65nm High Performance SRAM Technology with 25F$^2$, 0.16um$^2$S$^3$ (Stacked Single-crystal Si) SRAM Cell, and Stacked Peripheral SSTFT for Ultra High Density and High Speed Applications," Proceedings of ESSDERC, Grenoble, France, 2005, pp. 549-552.
Katsumata et al., "Pipe-shaped BiCS Flash Memory with 16 Stacked Layers and Multi-Level-Cell Operation for Ultra High Density Storage Devices," Symposium on VLSI Technology Digest of Technical Papers, 2009 pp. 136-137.

* cited by examiner

*Primary Examiner* — Asok K Sarkar
(74) *Attorney, Agent, or Firm* — Harness, Dickey & Pierce, P.L.C.

(57) ABSTRACT

According to example embodiments of inventive concepts, a method of fabricating a semiconductor device includes forming a sacrificial pattern having SiGe on a crystalline silicon substrate. A body having crystalline silicon is formed on the sacrificial pattern. At least one active element is formed on the body. An insulating layer is formed to cover the sacrificial pattern, the body, and the active element. A contact hole is formed to expose the sacrificial pattern through the insulating layer. A void space is formed by removing the sacrificial pattern. An amorphous silicon layer is formed in the contact hole and the void space. The amorphous silicon layer is transformed into a metal silicide layer.

19 Claims, 37 Drawing Sheets

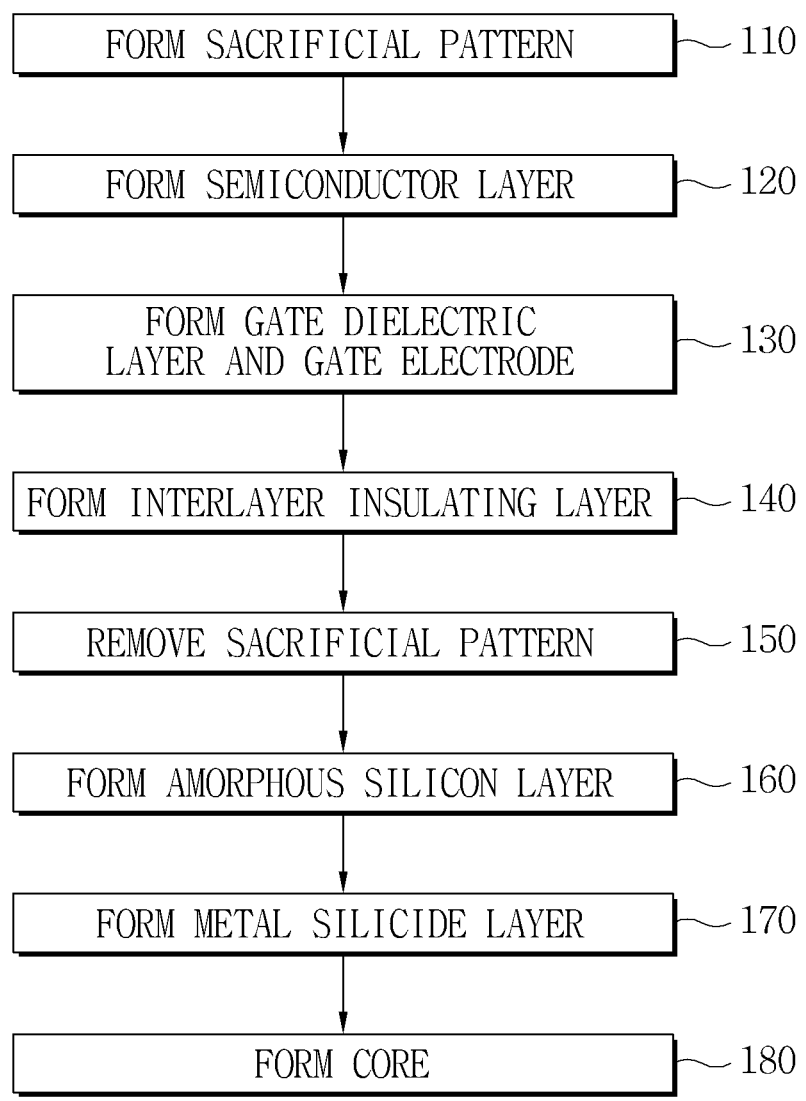

METHOD OF FABRICATING SEMICONDUCTOR DEVICE HAVING BURIED WIRING AND RELATED DEVICE

CROSS-REFERENCE TO RELATED APPLICATION

This application claims priority under 35 U.S.C. §119 to Korean Patent Application No. 10-2012-0003147 filed on Jan. 10, 2012, the disclosure of which is hereby incorporated by reference in its entirety.

BACKGROUND

1. Field

Example embodiments of inventive concepts relate to a method of fabricating a semiconductor device in which wirings are buried under active elements, and/or a related device.

2. Description of Related Art

Various methods that form wirings buried under active elements have been researched.

SUMMARY

Example embodiments of inventive concepts relate to a method of fabricating a semiconductor device and/or a related device in which contamination of the semiconductor substrate can be reduced (and/or prevented) and electrical resistance of a buried wiring can be reduced.

According to example embodiments of inventive concepts, a method of fabricating a semiconductor device includes forming a sacrificial pattern having SiGe on a substrate having crystalline silicon, forming a body having crystalline silicon on the sacrificial pattern, forming at least one active element on the body, forming an insulating layer that covers the sacrificial pattern, the body and the at least one active element, forming a contact hole to expose the sacrificial pattern through the insulating layer, forming a void space by removing the sacrificial pattern, forming an amorphous silicon layer in the contact hole and the void space, and transforming the amorphous silicon layer into a metal silicide layer.

Forming the sacrificial pattern may include performing a first epitaxial growth process, and forming the body may include performing a second epitaxial growth process.

The sacrificial pattern may directly contact the substrate and the body.

The substrate and the body may include P-type impurities.

The amorphous silicon layer may directly contact the substrate and the body, and the metal silicide layer may directly contact the body.

The method may further include forming a core surrounded by the metal silicide layer. The core may be formed in the contact hole, and the metal silicide layer may be formed to fill the void space and surround side surfaces of the core.

The core may be formed in the void space and the contact hole, and the metal silicide layer may be formed to surround a surface of the core.

A conductive plug may be formed in the contact hole and on the conductive plug. The conductive plug may contact the metal silicide layer.

Transforming the amorphous silicon layer into the metal silicide layer may include forming a metal layer that contacts the amorphous silicon layer, and heat-treating the metal layer and the amorphous silicon layer.

Forming the at least one active element may include forming a gate dielectric layer on the body before the forming the metal layer, and forming a gate electrode on the gate dielectric layer.

In accordance with example embodiments of inventive concepts, a method of fabricating a semiconductor device includes forming a sacrificial pattern on a substrate, forming an active element on the sacrificial pattern, forming an insulating layer that covers the sacrificial pattern and the active element, forming a contact hole that exposes the sacrificial pattern through the insulating layer, forming a void space by removing the sacrificial pattern, forming an amorphous silicon layer in the contact hole and the void space, transforming the amorphous silicon layer into a metal silicide layer, forming a conductive pattern on the metal silicide layer.

Forming the metal silicide layer and the conductive pattern may include exposing an upper end region of the contact hole by etching-back the amorphous silicon layer, forming a metal layer in the upper end region of the contact hole, forming the metal silicide layer by heat-treating the metal layer and the amorphous silicon layer, exposing the upper end region of the contact hole by removing the metal layer, and forming the conductive pattern in the upper end region of the contact hole.

Forming the metal silicide layer and the conductive pattern may include forming the amorphous silicon layer to cover side walls of the contact hole and fill the void space, forming a metal layer on the amorphous silicon layer, forming the metal silicide layer by heat-treating the metal layer and the amorphous silicon layer, removing the metal layer, and forming the conductive pattern on the metal silicide layer. The conductive pattern may be formed in the contact hole. The metal silicide layer may be formed to fill the void space. The metal silicide layer may be formed to surround side surfaces of the conductive pattern.

Forming the metal silicide layer and the conductive pattern may include forming the amorphous silicon layer on side walls of the contact hole and inner walls of the void space, forming a metal layer on the amorphous silicon layer, forming the metal silicide layer by heat-treating the metal layer and the amorphous silicon layer, removing the metal layer, and forming the conductive pattern on the metal silicide layer. The conductive pattern may be formed in the contact hole and the void space. The metal silicide layer may be formed to surround the conductive pattern.

According to example embodiments of inventive concepts, a method of fabricating a semiconductor device includes: forming a sacrificial pattern on a substrate; forming a stacked structure including at least one active element on the sacrificial pattern, the stacked structure defining at least one contact hole that exposes the sacrificial pattern; removing the sacrificial pattern to form a void pattern between the substrate and the stacked structure; forming an amorphous silicon layer in the at least one contact hole and the void pattern; transforming the amorphous silicon layer into a metal silicide layer; and forming a conductive pattern on the metal silicide layer.

The amorphous silicon layer may partially fill at least one of the at least one contact hole and the void pattern. The method may further include forming a conductive plug in at least one of the at least one contact hole and the void pattern after the transforming the amorphous silicon layer into the metal silicide layer.

A part of the metal silicide layer may surround a part of the conductive plug.

A lowermost surface of the conductive plug may be on an uppermost surface of the metal silicide layer.

Transforming the amorphous silicon layer into the metal silicide layer may include forming a metal layer that contacts the amorphous silicon layer, and heat-treating the metal layer and the amorphous silicon layer.

Details of example embodiments of inventive concepts are included in the detailed description and the drawings.

BRIEF DESCRIPTION OF THE DRAWINGS

The foregoing and other features and advantages of inventive concepts will be apparent from the more particular description of example embodiments of inventive concepts, as illustrated in the accompanying drawings in which like reference characters refer to the same parts throughout the different views. The drawings are not necessarily to scale, emphasis instead being placed upon illustrating the principles of example embodiments of inventive concepts. In the drawings:

FIG. 1 is a flowchart illustrating a method of fabricating a semiconductor device in accordance with example embodiments of inventive concepts;

DETAILED DESCRIPTION OF THE EMBODIMENTS

Figure 2A:
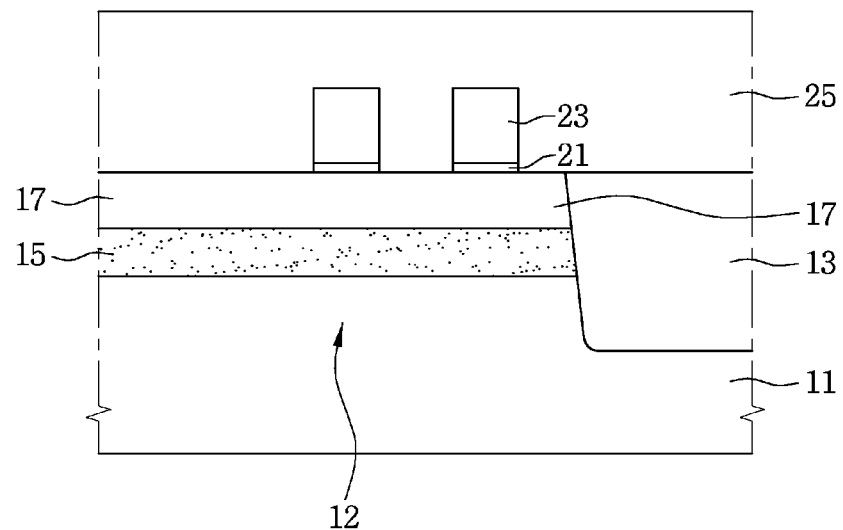
FIGS. 2A to 2H are cross-sectional views that illustrate a method of fabricating a semiconductor device according to example embodiments of inventive concepts.

Example embodiments will now be described more fully with reference to the accompanying drawings, in which some example embodiments of inventive concepts are shown. Example embodiments of inventive concepts, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of inventive concepts are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of inventive concepts.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of fabricating a semiconductor device in accordance with example embodiments of inventive concepts.

Referring to FIG. 1, in accordance with example embodiments of inventive concepts, a method of fabricating a semiconductor device may include forming a sacrificial pattern (operation 110), forming a semiconductor layer (operation 120), forming a gate dielectric layer and a gate electrode (operation 130), forming an interlayer insulating layer (operation 140), removing the sacrificial pattern (operation 150), forming an amorphous silicon layer (operation 160), forming a metal silicide layer (operation 170), and forming a core (operation 180). The metal silicide layer may be referred to as a buried wiring.

The process for forming the core may be omitted. Conductive patterns such as a conductive plug and metal wiring may be formed on the metal silicide layer. Hereafter, example embodiments of inventive concepts are described with reference to the following drawings.

FIGS. 2A to 2H are cross-sectional views that illustrate a method of fabricating a semiconductor device according to example embodiments of inventive concepts.

Referring to FIGS. 1 and 2A, an element isolation layer 13 may be formed to define an active region 12 in a substrate 11. A sacrificial pattern 15 may be formed on the active region 12 (operation 110). A body 17 may be formed on the sacrificial pattern 15 (operation 120). Side surfaces of the sacrificial pattern 15 and the body 17 may be surrounded by the element isolation layer 13. A gate dielectric layer 21 and a gate electrode 23 may be formed on the body 17 (operation 130). An interlayer insulating layer 25 may be formed to cover the gate electrode 23 (operation 140). The interlayer insulating layer 25 may cover one entire surface of the substrate 11.

The substrate 11 may be a semiconductor substrate such as a silicon wafer. The active region 12 may include P-type or N-type impurities. For example, the active region 12 may be single crystalline silicon having P-type impurities. The element isolation layer 13 may be formed by using shallow trench isolation (STI) technology. The element isolation layer 13 may include at least one insulating layer including a dielectric material, such as one of silicon oxide, silicon nitride, silicon oxynitride, and a combination of thereof. However, example embodiments are not limited thereto.

A material of the sacrificial pattern 15 may be different than a material of the active region 12. The sacrificial pattern 15 may be a single crystalline semiconductor including different materials from the active region 12. For example, the active region 12 may include single crystalline silicon, and the sacrificial pattern 15 may include SiGe, but example embodiments of inventive concepts are not limited thereto. The sacrificial pattern 15 may be formed on the active region 12 using a first epitaxial growth process such as a vapor phase epitaxial growth (VPE) method, a liquid phase epitaxial growth (LPE) method, or a solid phase epitaxial growth (SPE) method. The sacrificial pattern 15 may be formed using a selective epitaxial growth (SEG) method.

The body 17 may be referred to as a semiconductor layer. The body 17 may be formed on the sacrificial pattern 15 using a second epitaxial growth process. The body 17 may include a single crystalline semiconductor such as single crystalline silicon. The body 17 may include P-type or N-type impurities. For example, the body 17 may be single crystalline silicon having P-type impurities. The sacrificial pattern 15 may be in contact with the active region 12 and the body 17. The sacrificial pattern 15 may be a material layer having an etch selectivity with regard to the active region 12 and the body 17. The sacrificial pattern 15 may include different materials from the body 17.

The gate dielectric layer 21 may include a dielectric material, such as one of silicon oxide, silicon nitride, silicon oxynitride, high-K material, and a combination of thereof. For example, the gate dielectric layer 21 may be silicon oxide formed by a thermal oxidation method. The gate electrode 23 may cross over the body 17. The gate electrode 23 may be formed using a thin forming process and a patterning process. The gate electrode 23 may include a conductor such as one of poly-silicon, a metal, metal silicide, metal nitride, and a combination of thereof. For example, the gate electrode 23 may be formed of a poly-silicon. The interlayer insulating layer 25 may include a dielectric material such as one of silicon oxide, silicon nitride, silicon oxynitride, and a combination of thereof. For example, the interlayer insulating layer 25 may be formed of silicon oxide. However, example embodiments of inventive concepts are not limited thereto.

Many different types of passive/active elements that include the gate dielectric layer 21 and the gate electrode 23 may be further formed in the interlayer insulating layer 25. For example, switching devices and/or many different types of data storage elements may be formed on the body 17. The switching devices may include diodes or transistors. The data storage elements may include a charge trap layer, a phase-change material layer, a resistive change material layer, a capacitor, or a magnetic tunnel junction (MTJ).

Figure 2B:
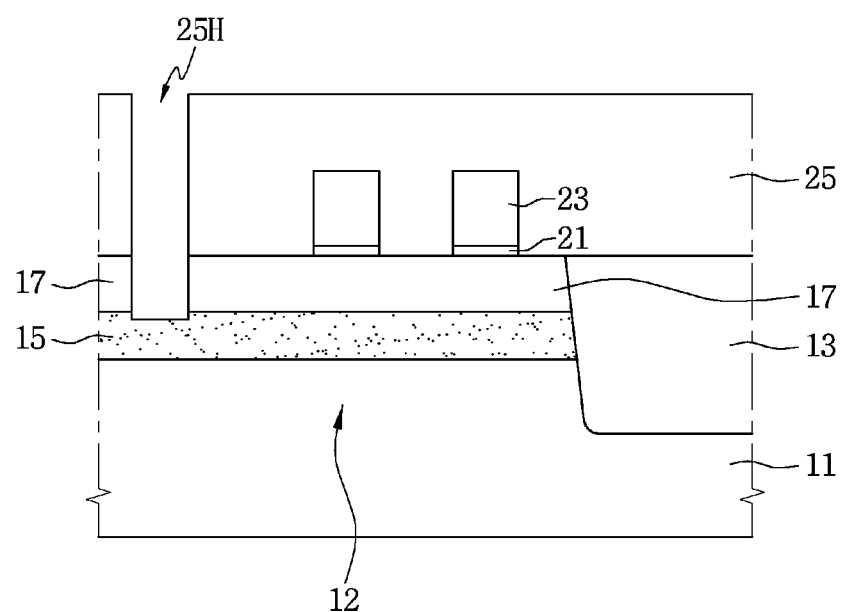

Referring to FIGS. 1 and 2B, a contact hole 25H to expose the sacrificial pattern 15 may be formed through the interlayer insulating layer 25 and the body 17. The formation of the contact hole 25H may be applied with a patterning process that includes a photolithography process and an etching process. The contact hole 25 may expose a part of the sacrificial pattern 15 and/or partially remove a part of the sacrificial pattern.

Figure 2C:
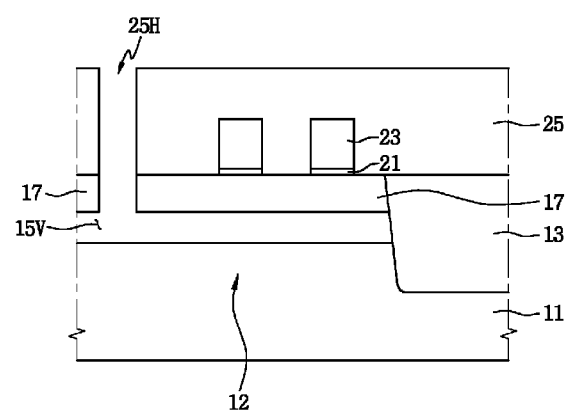

Referring to FIGS. 1 and 2C, a void space 15V may be formed by removing the sacrificial pattern 15 (operation 150). The void space 15V may be in communication with the contact hole 25H. The body 17 and the active region 12 may be exposed through the void space 15V.

Figure 2D:
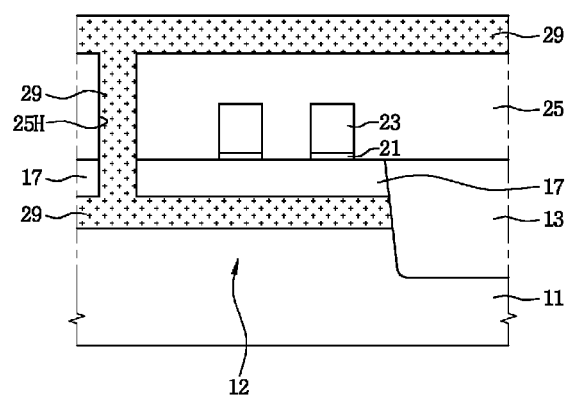

Referring to FIGS. 1 and 2D, an amorphous silicon layer 29 may be formed to cover the interlayer insulating layer 25 and fill the inside of the void space 15V and the contact hole 25H (operation 160). The amorphous silicon layer 29 may exhibit far superior filling characteristics. Even if the void space 15V and the contact hole 25H have a long and bending structure, the void space 15V and the contact hole 25H may be closely buried with the amorphous silicon layer 29. The amorphous silicon layer 29 may be in contact with the active region 12 and the body 17.

Figure 2E:
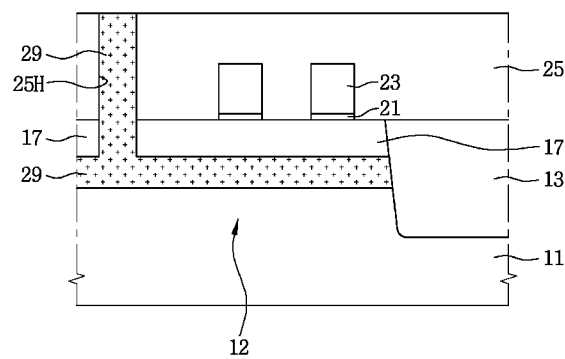

Referring to FIGS. 1 and 2E, the interlayer insulating layer 25 may be exposed by planarizing the amorphous silicon layer 29. The amorphous silicon layer 29 may be preserved in the contact hole 25H and the void space 15V.

Figure 2F:
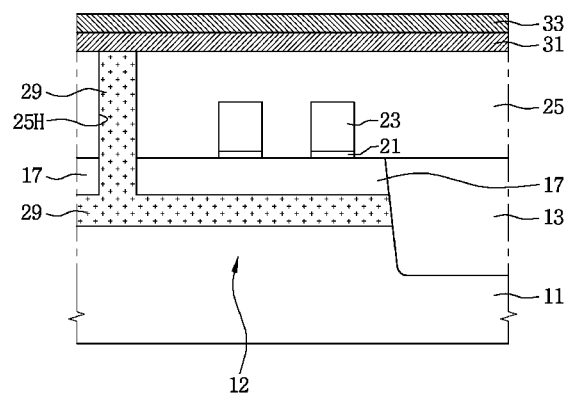

Referring to FIGS. 1 and 2F, a metal layer 31 and a capping layer 33 may in turn be formed on the interlayer insulating layer 25. The metal layer 31 may be in contact with the amorphous silicon layer 29. The metal layer 31 may include Co, Ni, Ti, Ta, W, or a combination of thereof. The metal layer 31 may be covered with the capping layer 33. The capping layer 33 may include metal nitride such as TiN.

Figure 2G:
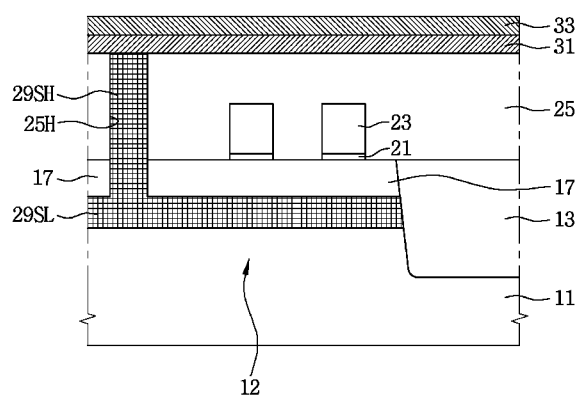

Referring to FIGS. 1 and 2G, a metal silicide layer 29SH and 29SL may be formed using a silicide transforming process (operation 170). A process of heat-treating the metal layer 31 and the amorphous silicon layer 29 may be included in the formation of the metal silicide layer 29SH and 29SL. For example, the heat-treating process of the metal layer 31 and the amorphous silicon layer 29 may be performed at a temperature of approximately 400° C. The metal silicide layer 29SH and 29SL may include CoSi, NiSi, TiSi, TaSi, WSi, or a combination of thereof. The metal silicide layer 29SH and 29SL may include a metal silicide plug 29SH formed in the contact hole 25H, and a metal silicide pattern 29SL formed in the void space 15V. The metal silicide pattern 29SL may be in continuity with the metal silicide plug 29SH. The metal silicide pattern 29SL may be in contact with the active region 12 and the body 17.

The inventors have confirmed that the amorphous silicon layer 29 exhibits lower reaction energy with a metal than single crystalline silicon. The reaction energy between the metal layer 31 and the amorphous silicon layer 29 may be lower than that between the metal layer 31 and the active region 12. In addition, the reaction energy between the metal layer 31 and the amorphous silicon layer 29 may be lower than that between the metal layer 31 and the body 17. A metal included in the metal layer 31 may be selectively coupled with the amorphous silicon layer 29 to form the metal silicide layer 29SH and 29SL.

Figure 2H:
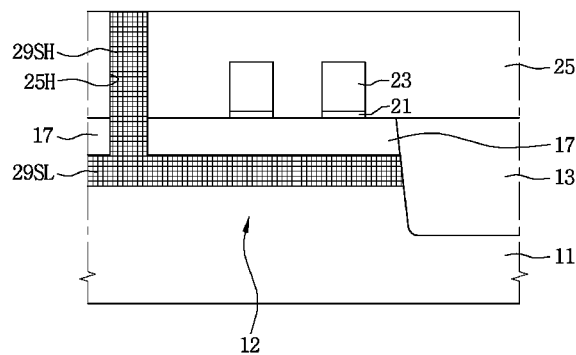

Referring to FIGS. 1 and 2H, the metal silicide plug 29SH and the interlayer insulating layer 25 may be exposed by removing the capping layer 33 and the metal layer 31.

In accordance with example embodiments of inventive concepts, the metal silicide layer 29SH and 29SL may be formed after active elements that include the gate dielectric layer 21 and the gate electrode 23 are formed. In the method of forming the metal silicide layer 29SH and 29Sl, degradation of the electrical characteristics of the active elements due to metal contaminants can be reduced (and/or prevented). In addition, the metal silicide layer 29SH and 29SL exhibits a lower electrical resistance than a silicon pattern doped with impurities. The metal silicide layer 29SH and 29SL may have a much higher current driving capability than the silicon pattern doped with impurities. In accordance with example embodiments of inventive concepts, the semiconductor device may have an advantage in high-integration due to the metal silicide layer 29SH and 29SL.

FIGS. 3A to 3E are cross-sectional views illustrating a method of fabricating a semiconductor device in accordance with example embodiments of inventive concepts.

Figure 3A:
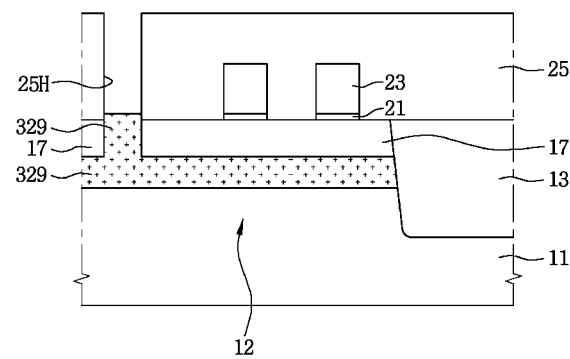
FIGS. 3A to 3E are cross-sectional views that illustrate a method of fabricating a semiconductor device according to example embodiments of inventive concepts.

Referring to FIGS. 1 and 3A, a contact hole 25H may be partially exposed by performing an etch-back process of an amorphous silicon layer 329. The amorphous silicon layer 329 may be preserved in a lower end region of the contact hole 25H and in the void space (15V shown in FIG. 2C). An upper end of the amorphous silicon layer 329 may be preserved at a higher level than the body 17.

Figure 3B:
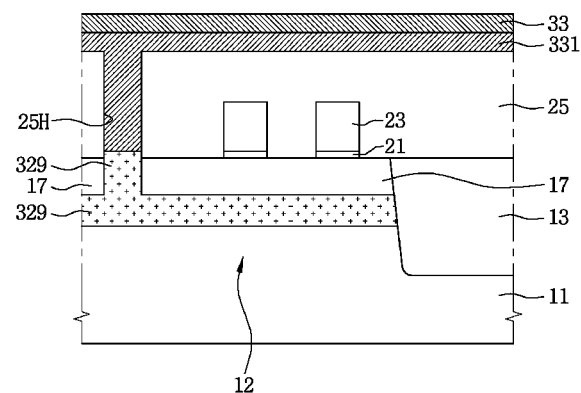

Referring to FIGS. 1 and 3B, a metal layer 331 and a capping layer 33 may in turn be formed on the interlayer insulating layer 25. The metal layer 331 may fill the contact hole 25H. The metal layer 331 may be in contact with the amorphous silicon layer 329. The metal layer 31 may be covered with the capping layer 33.

Figure 3C:
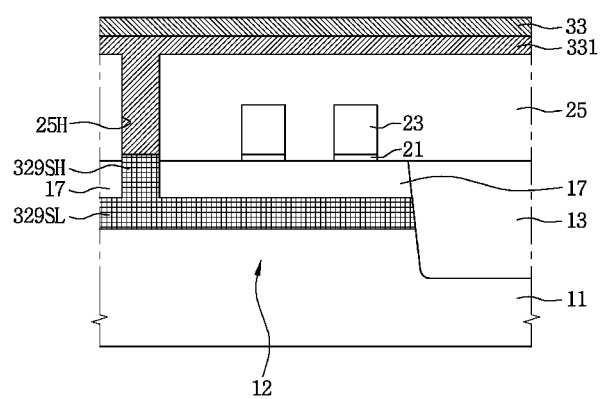

Referring to FIGS. 1 and 3C, a metal silicide layer 329SH and 329SL may be formed using a silicide transforming process (operation 170). The metal silicide layer 329SH and 329SL may include a metal silicide plug 329SH formed in the contact hole 25H, and a metal silicide pattern 329SL formed in the void space (see 15V shown in FIG. 2C). The metal silicide pattern 329SL may be in contact with the active region 12 and the body 17.

Figure 3D:
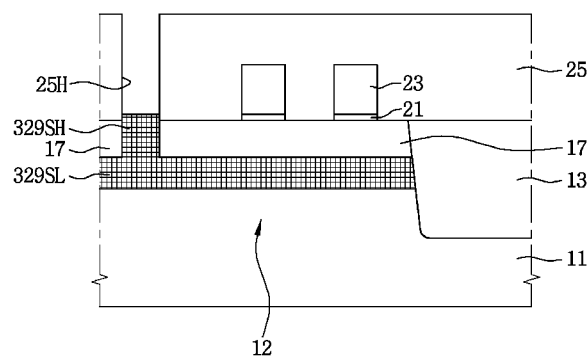

Referring to FIGS. 1 and 3D, the metal silicide plug 329SH and the interlayer insulating layer 25 may be exposed by removing the capping layer 33 and the metal layer 331. An upper region of the contact hole 25H may be exposed on the metal silicide plug 329SH.

Figure 3E:
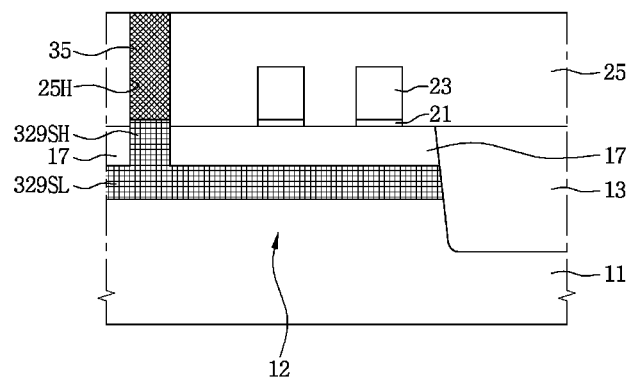

Referring to FIGS. 1 and 3E, a conductive plug 35 may be formed which fills the upper region of the contact hole 25H. The conductive plug 35 may be formed using a thin forming process and a planarizing process. The conductive plug 35 may be in contact with the metal silicide plug 329SH. The conductive plug 35 may include one of a metal, metal nitride, metal silicide, a conductive carbon group, poly-silicon, and a combination of thereof. For example, the conductive plug 35 may include one of W, WN, TiN, TaN, Ru, and a combination thereof. However, example embodiments of inventive concepts are not limited thereto.

FIGS. 4A to 4F are cross-sectional views of processes for explaining a method of fabricating a semiconductor device in accordance with example embodiments of inventive concepts.

Figure 4A:
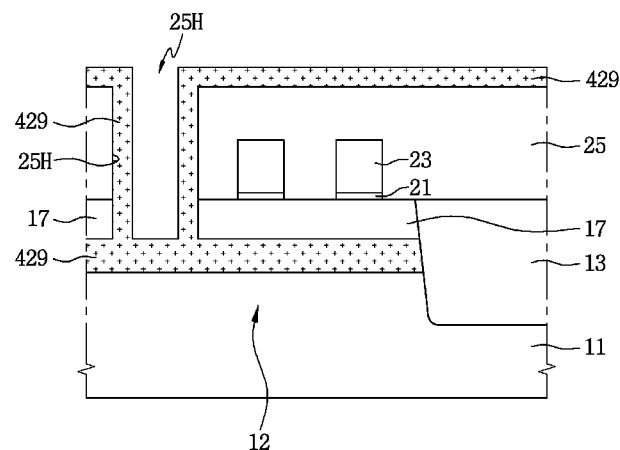
FIGS. 4A to 4F are cross-sectional views that illustrate a method of fabricating a semiconductor device according to example embodiments of inventive concepts.

Referring to FIGS. 1 and 4A, an amorphous silicon layer 429 may be formed to cover a side wall of the contact hole 25H, fill the void space (15V shown in FIG. 2C) and cover the interlayer insulating layer 25 (operation 160). The amorphous silicon layer 429 may exhibit far superior surface coverage. The side wall of the contact hole 25H may be covered with the amorphous silicon layer 429 to a constant (or about constant) thickness.

Figure 4B:
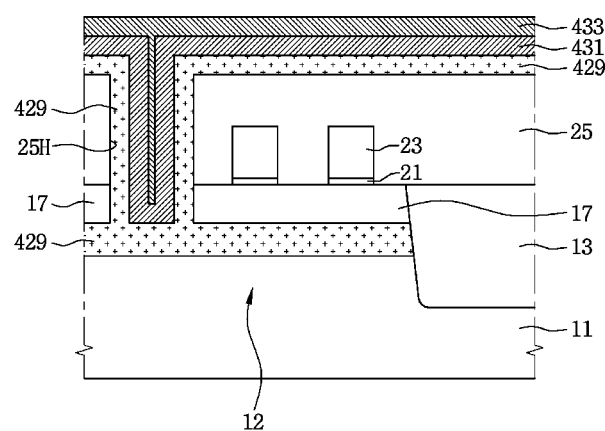

Referring to FIGS. 1 and 4B, a metal layer 431 and a capping layer 433 may in turn be formed on the amorphous silicon layer 429. The metal layer 431 and the capping layer 433 may fill the contact hole 25H. The metal layer 431 may be in contact with the amorphous silicon layer 429.

Figure 4C:
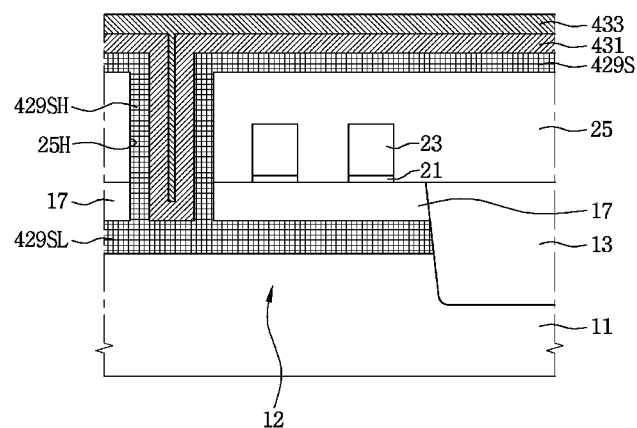

Referring to FIGS. 1 and 4C, a metal silicide layer 429S, 429SH and 429SL may be formed using a silicide transforming process (operation 170). The metal silicide layer 429S, 429SH and 429SL may include a metal silicide plug 429SH formed in the contact hole 25H, and a metal silicide pattern 429SL formed in the void space (15V shown in FIG. 2C). The metal silicide pattern 429SL may be in contact with the active region 12 and the body 17.

Figure 4D:
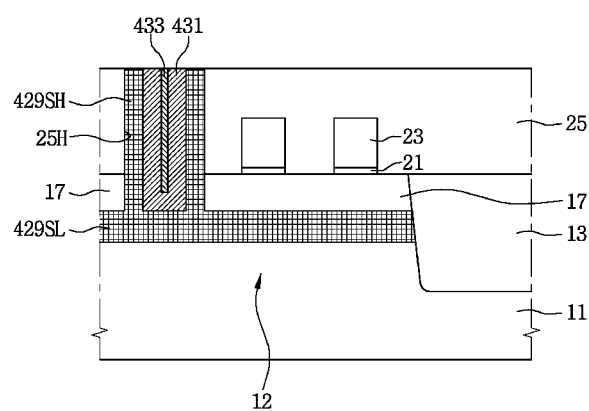

Referring to FIGS. 1 and 4D, the interlayer insulating layer 25 may be exposed by planarizing the capping layer 433, the metal layer 431 and the metal silicide layer 429S, 429SH and 429SL. The capping layer 433, the metal layer 431 and the metal silicide plug 429SH may be preserved in the contact hole 25H.

Figure 4E:
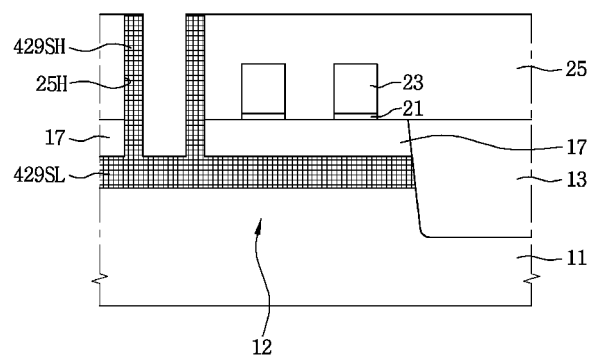

Referring to FIGS. 1 and 4E, the capping layer 433 and the metal layer 431 that remain in the contact hole 25H may be removed.

Figure 4F:
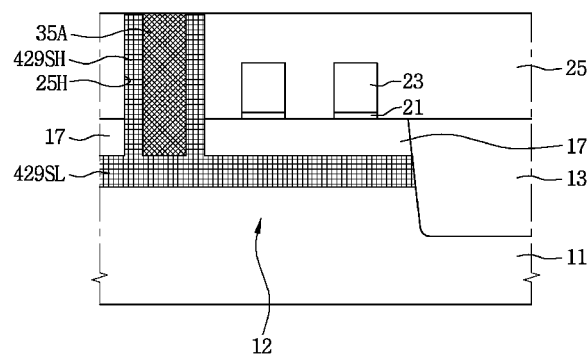

Referring to FIGS. 1 and 4F, a core 35A may be formed in the contact hole 25H (operation 180). The core 35A may be formed using a thin forming process and a planarizing process. The metal silicide plug 429SH may surround a side surface of the core 35A. The core 35A may be in contact with the metal silicide plug 429SH. The core 35A may include a metal, metal nitride, metal silicide, a conductive carbon group, poly-silicon, or a combination of thereof. For example, the core 35A may include W, WN, TiN, TaN, Ru, or a combination thereof. However, example embodiments of inventive concepts are not limited thereto FIGS. 5A to 5C are cross-sectional views of processes for explaining a method of fabricating a semiconductor device in accordance with example embodiments of inventive concepts.

Figure 5A:
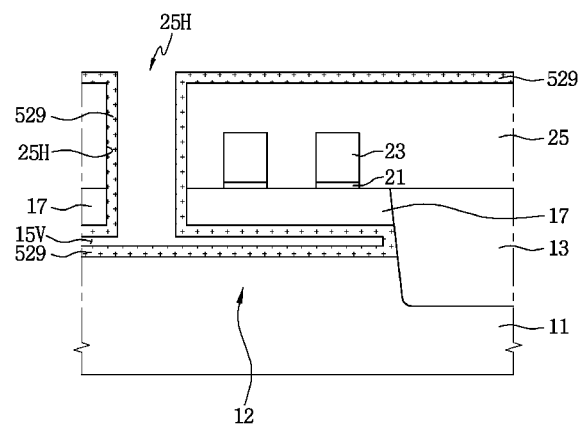
FIGS. 5A to 5C are cross-sectional views that illustrate a method of fabricating a semiconductor device according to example embodiments of inventive concepts.

Referring to FIGS. 1 and 5A, an amorphous silicon layer 529 may be formed to cover side walls of the contact hole 25H and the void space 15V and the interlayer insulating layer 25 (operation 160). The side walls of the contact hole 25H and the void space 15V may be covered with the amorphous silicon layer 529 to a constant (and/or about constant) thickness. The contact hole 25H and the void space 15V may be reduced in size by the amorphous silicon layer 529. The amorphous silicon layer 529 may be in contact with the active region 12 and the body 17.

The amorphous silicon layer 529 may exhibit far superior surface coverage. Even if the contact hole 25H and the void space 15V are long, narrow, bent and complicated, the amorphous silicon layer 529 may be formed to a constant thickness without an interruption on inner walls of the contact hole 25H and the void space 15V.

Figure 5B:
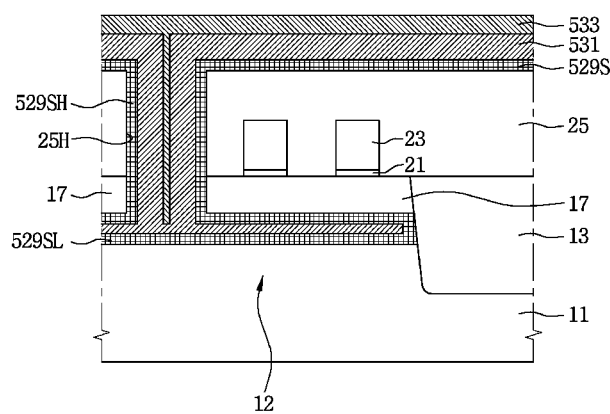
Figure 5C:
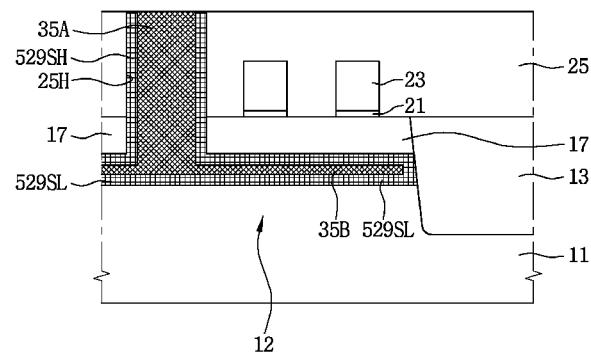

Referring to FIGS. 1 and 5B, a metal layer 531 and a capping layer 533 may in turn be formed on the amorphous silicon layer 529. A metal silicide layer 529S, 529SH and 529SL may be formed using a silicide transforming process (operation 170).

The metal layer 531 may fill the contact hole 25H and the void space 15V. The metal silicide layer 529S, 529SH and 529SL may include a metal silicide plug 529SH formed in the contact hole 25H, and a metal silicide pattern 529SL formed in the void space 15V. The metal silicide pattern 529SL may be in contact with the active region 12 and the body 17.

Referring to FIGS. 1 and 5C, the metal layer 531 and the capping layer 533 are removed, and then the core 35A and 35B may be formed in the contact hole 25H and the void space 15V (operation 180). The core 35A and 35B may be formed using a thin forming process and a planarizing process. The core 35A and 35B may include a core plug 35A formed in the contact hole 25H, and a core pattern 35B formed in the void space 15V. The core pattern 35B may be in continuity with the core plug 35A. The core 35A and 35B may include a metal, metal nitride, metal silicide, a conductive carbon group, poly-silicon, or a combination of thereof. For example, the core 35A and 35B may include W, WN, TiN, TaN, Ru, or a combination thereof. However, example embodiments of inventive concepts are not limited thereto.

The metal silicide plug 529SH may surround a side surface of the core 35A. The core plug 35A may be in contact with the metal silicide plug 529SH. The metal silicide pattern 529SL may surround upper and lower surfaces of the core pattern 35B. The metal silicide pattern 529SL may be in contact with the core pattern 35B FIGS. 6A and 6B are cross-sectional views of processes for explaining a method of fabricating a semiconductor device in accordance with example embodiments of inventive concepts.

Figure 6A:
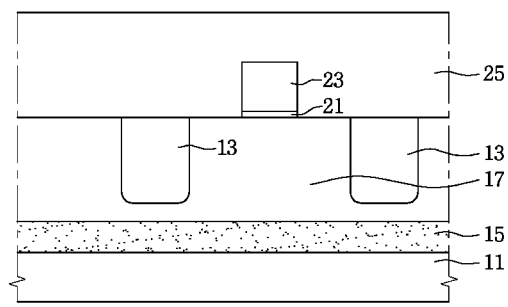
FIGS. 6A to 6B are cross-sectional views that illustrate a method of fabricating a semiconductor device according to example embodiments of inventive concepts.

Referring to FIG. 6A, a sacrificial pattern 15 may be formed on the substrate 11. A body 17 may be formed on the sacrificial pattern 15. An element isolation layer 13 may be formed in the body 17. A gate dielectric layer 21 and a gate electrode 23 may in turn be formed on the body 17. An interlayer insulating layer 25 may be formed to cover the gate electrode 23.

The substrate 11 may include single crystalline silicon having P-type impurities. The sacrificial pattern 15 may be plate-shaped to cover a constant region of the substrate 11. The sacrificial pattern 15 may include different materials from the substrate 11. For example, the sacrificial pattern 15 may include SiGe. The sacrificial pattern 15 may be formed using epitaxial growth technology. The body 17 may be formed on the sacrificial pattern 15 using a second epitaxial growth process. The body 17 may include single crystalline silicon having P-type impurities. The sacrificial pattern 15 may be a material layer having an etch selectivity with regard to the active region 11 and the body 17. The sacrificial pattern 15 may include different materials from the body 17.

Figure 6B:
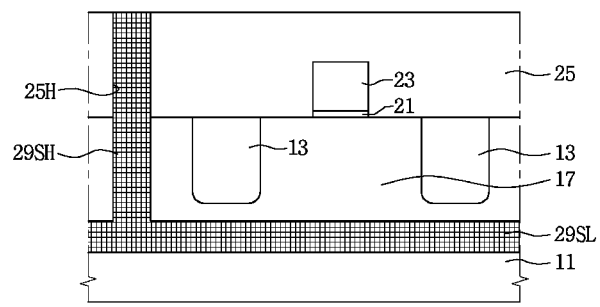

Referring to FIG. 6B, a metal silicide layer 29SH and 29SL may be formed using a silicide transforming process after a contact hole 25H to expose the sacrificial pattern 15 by passing through the interlayer insulating layer 25 and the body 17, is formed, and the sacrificial pattern 15 is removed. The metal silicide layer 29SH and 29SL may include a metal silicide plug 29SH and a metal silicide pattern 29SL. The metal silicide pattern 29SL may be in contact with the substrate 11 and the body 17.

Figure 7:
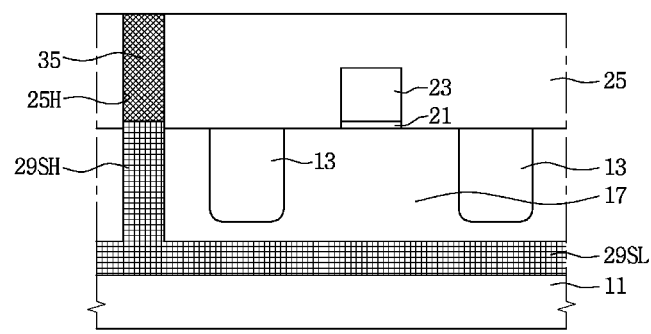
FIG. 7 is a cross-sectional view of a process for explaining a method of fabricating a semiconductor device in accordance with an embodiment of the inventive concepts.

FIG. 7 is a cross-sectional view of a process for explaining a method of fabricating a semiconductor device in accordance with example embodiments of inventive concepts.

Referring to FIG. 7, a conductive plug 35 may be formed on an upper region of a contact hole 25H. The conductive plug 35 may be in contact with a metal silicide plug 29SH. The metal silicide plug 29SH may be formed on a lower end region of the contact hole 25H.

Figure 8:
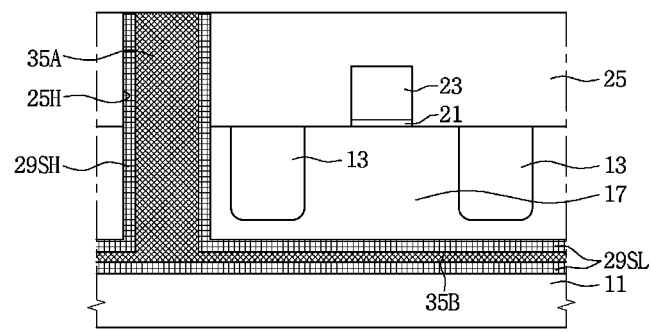
FIG. 8 is a cross-sectional view of a process for explaining a method of fabricating a semiconductor device in accordance with an embodiment of the inventive concepts.

FIG. 8 is a cross-sectional view of a process for explaining a method of fabricating a semiconductor device in accordance with example embodiments of inventive concepts.

Referring to FIG. 8, a core 35A and 35B and a metal silicide layer 29SH and 29SL which surrounds the core 35A and 35B may be formed. The metal silicide layer 29SH and 29SL may include a metal silicide plug 29SH and a metal silicide pattern 29SL. The metal silicide pattern 29SL may be in contact with the substrate 11 and the body 17. The core 35A and 35B may include a core plug 35A and a core pattern 35B. The core pattern 35B may be in continuity with the core plug 35A.

The metal silicide plug 29SH may surround a side surface of the core 35A. The core plug 35A may be in contact with the metal silicide plug 29SH. The metal silicide pattern 29SL may surround upper and lower surfaces of the core pattern 35B. The metal silicide pattern 29SL may be in contact with the core pattern 35B FIGS. 9A to 9B are cross-sectional views of processes for explaining a method of fabricating a semiconductor device in accordance with example embodiments of inventive concepts.

Figure 9A:
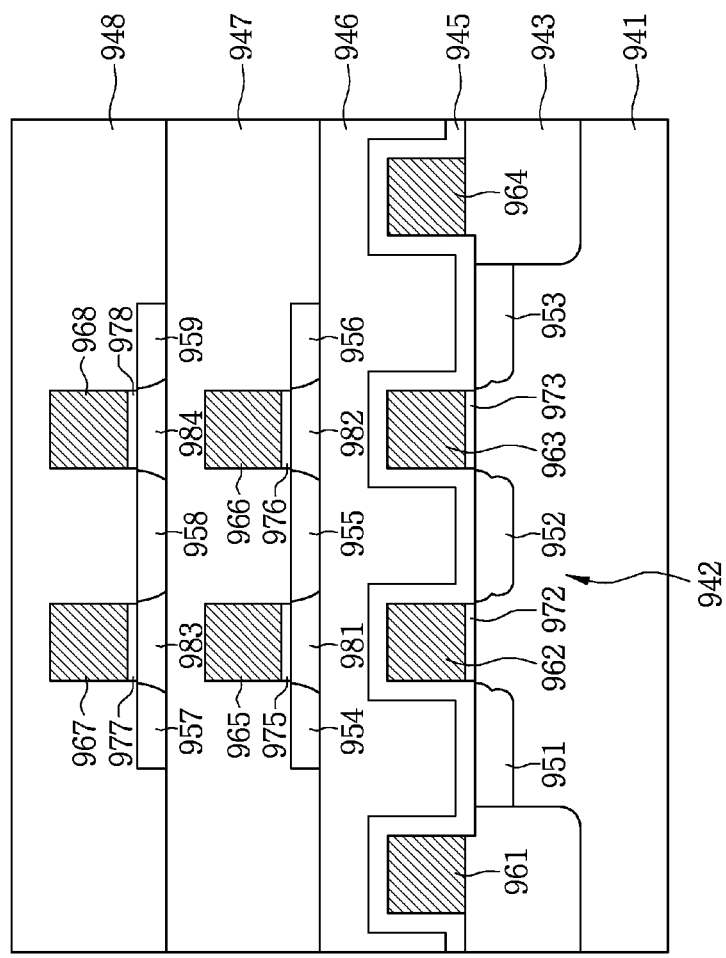
FIGS. 9A to 9K are cross-sectional views that illustrate a method of fabricating a semiconductor device according to example embodiments of inventive concepts.

Referring to FIG. 9A, an element isolation layer 943 may be formed to define an active region 942 on a substrate 941. First to eighth gate electrodes 961 to 968, gate dielectric layers 972, 973, 975, 976, 977 and 978, first to ninth source/drain regions 951 to 959, bodies 981, 982, 983 and 984, an etch stop layer 945, and first to third insulating layers 946 to 948 may be formed on the semiconductor substrate 941. Each of the second gate electrode 962 and the third gate electrode 963 may configure a pull-down transistor of a SRAM cell, each of the fifth gate electrode 965 and the sixth gate electrode 966 may configure a load transistor of the SRAM cell, and each of the seventh gate electrode 967 and the eighth gate electrode 968 may configure a pass transistor of the SRAM cell.

Figure 9B:
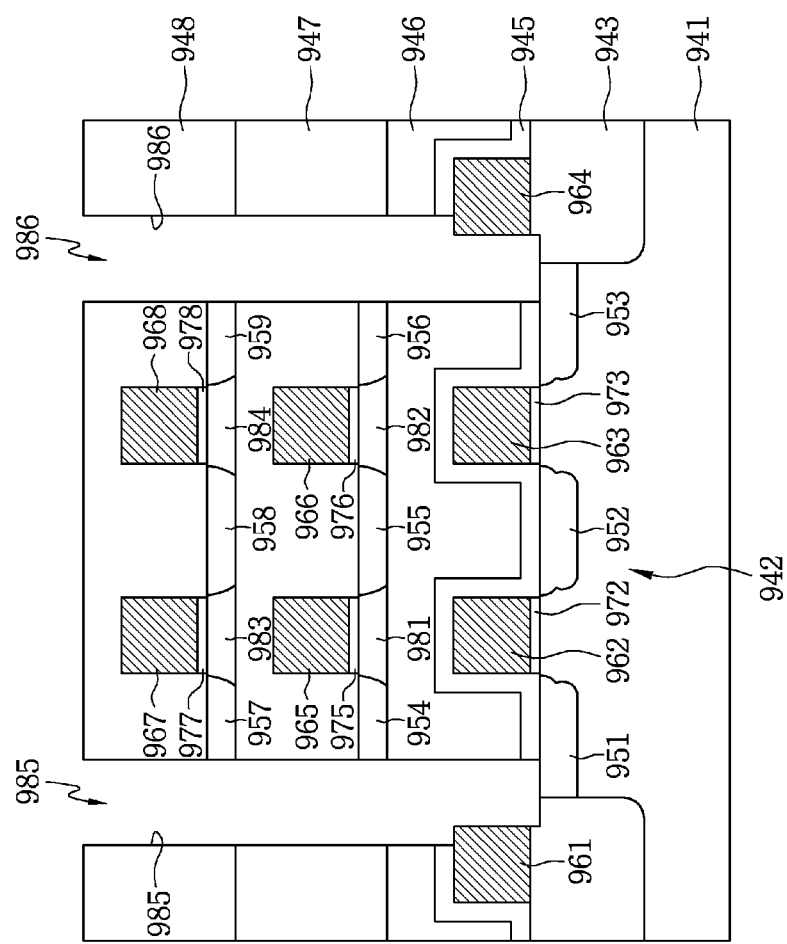

Referring to FIG. 9B, first and second contact holes 985 and 986 may be formed which pass through the first to third insulating layers 946 to 948 and an etch stop layer 945. The first gate electrode 961, the first source/drain region 951, the fourth source/drain region 954 and the seventh source/drain region 957 may be exposed in the first contact hole 985. The fourth gate electrode 964, the third source/drain region 953, the sixth source/drain region 956 and the ninth source/drain region 959 may be exposed in the second contact hole 986.

Figure 9C:
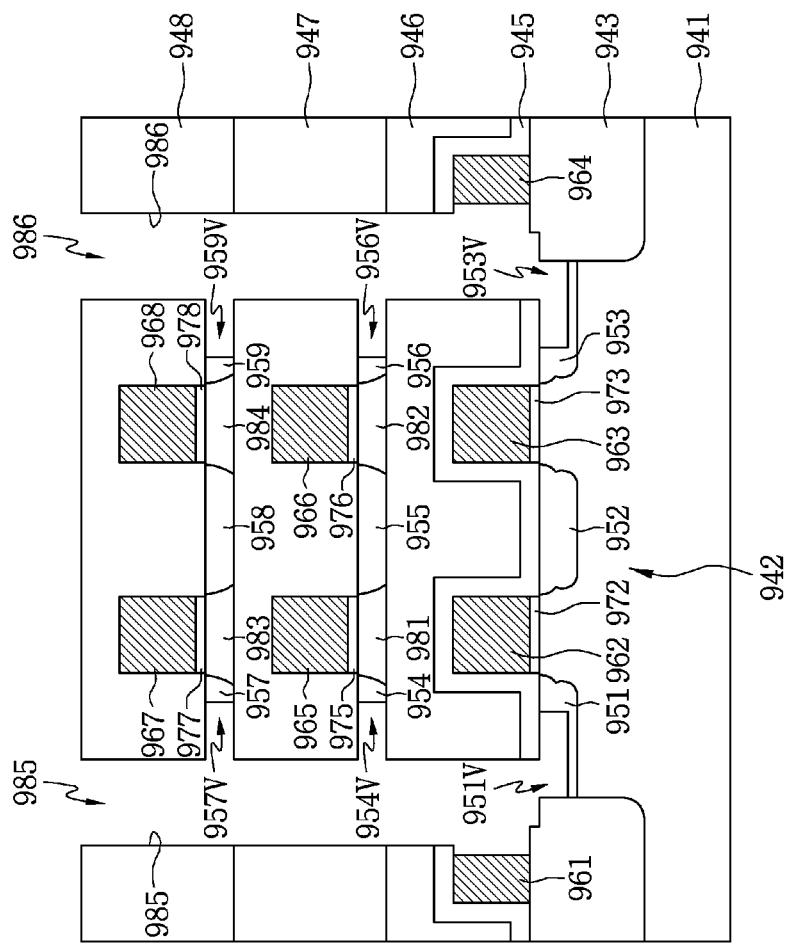

Referring to FIG. 9C, void spaces 951V, 953V, 954V, 956V, 957V and 959V may be formed by partially removing the first gate electrode 961, the fourth gate electrode 964, the first source/drain region 951, the third source/drain region 953, the fourth source/drain region 954, the sixth source/drain region 956, the seventh source/drain region 957 and the ninth source/drain region 959.

According to example embodiments of inventive concepts, at least one of the first source/drain region 951, the third source/drain region 953, the fourth source/drain region 954, the sixth source/drain region 956, the seventh source drain region 957 and the ninth source/drain region 959 may be entirely removed. Alternatively, the first source/drain region 951, the third source/drain region 953, the fourth source/drain region 954, the sixth source/drain region 956, the seventh source drain region 957 and the ninth source/drain region 959 may be entirely removed.

Figure 9D:
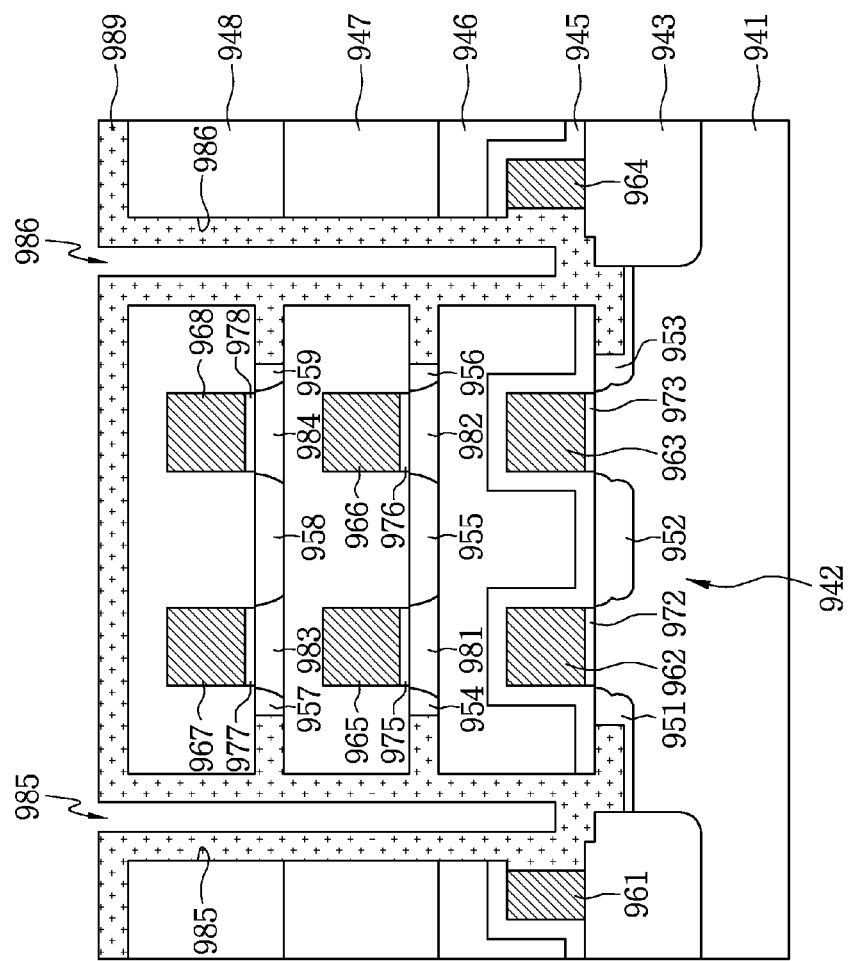

Referring to FIG. 9D, an amorphous silicon layer 989 may be formed in the first and second contact holes 985 and 986 and the void spaces 951V, 953V, 954V, 956V, 957V and 959V. The amorphous silicon layer 989 may exhibit far superior surface coverage.

Figure 9E:
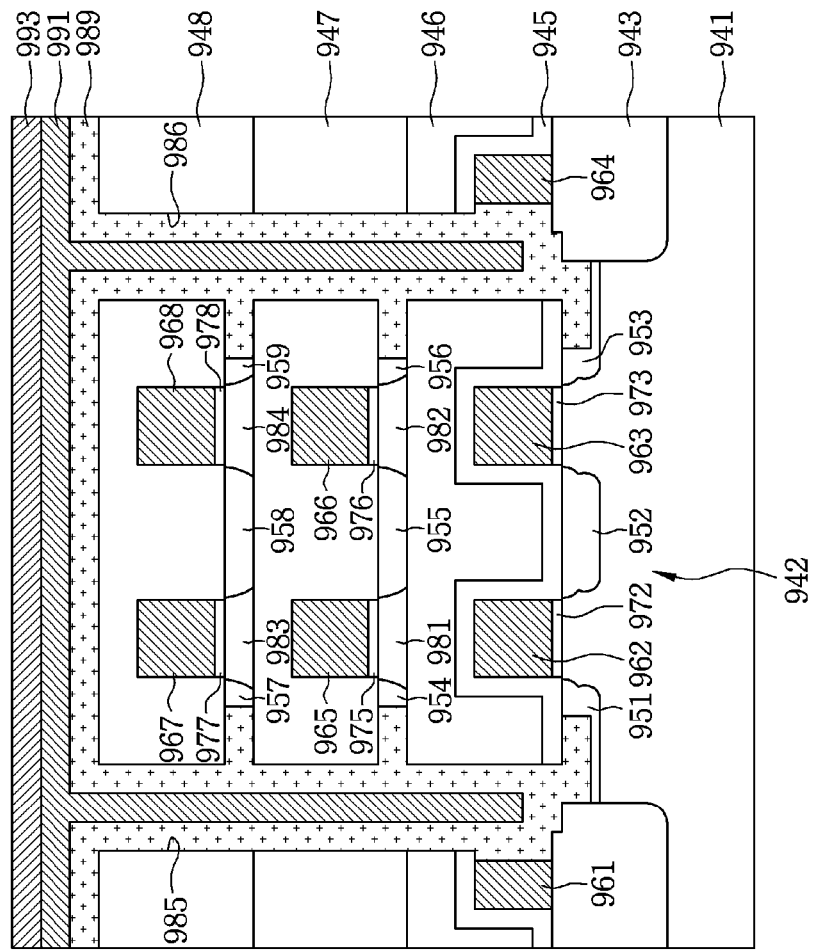

Referring to FIG. 9E, a metal layer 991 and a capping layer 993 may in turn be formed on the amorphous silicon layer 989.

Figure 9F:
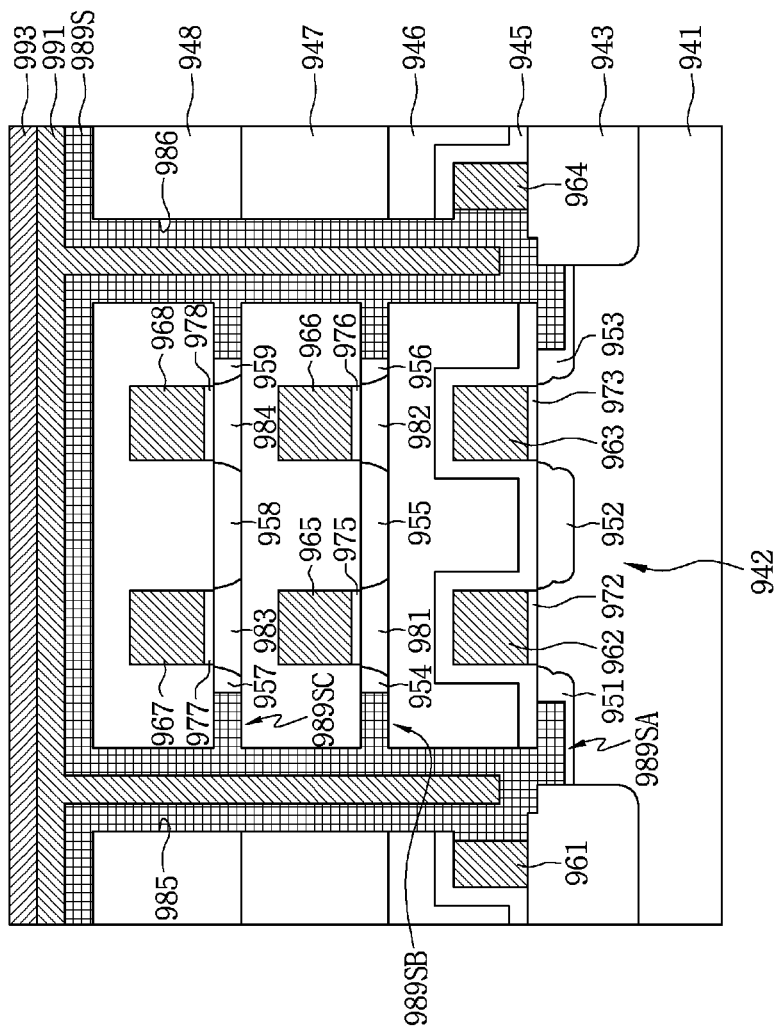

Referring to FIG. 9F, a metal silicide layer 989S may be formed using a silicide transforming process. The metal silicide layer 989S may include first to third metal silicide patterns 989SA to 989SC. The first metal silicide pattern 989SA may be in contact with the first source/drain region 951, the second metal silicide pattern 989SB may be in contact with the fourth source/drain region 954, and the third metal silicide pattern 989SC may be in contact with the seventh source/drain region 957.

Figure 9G:
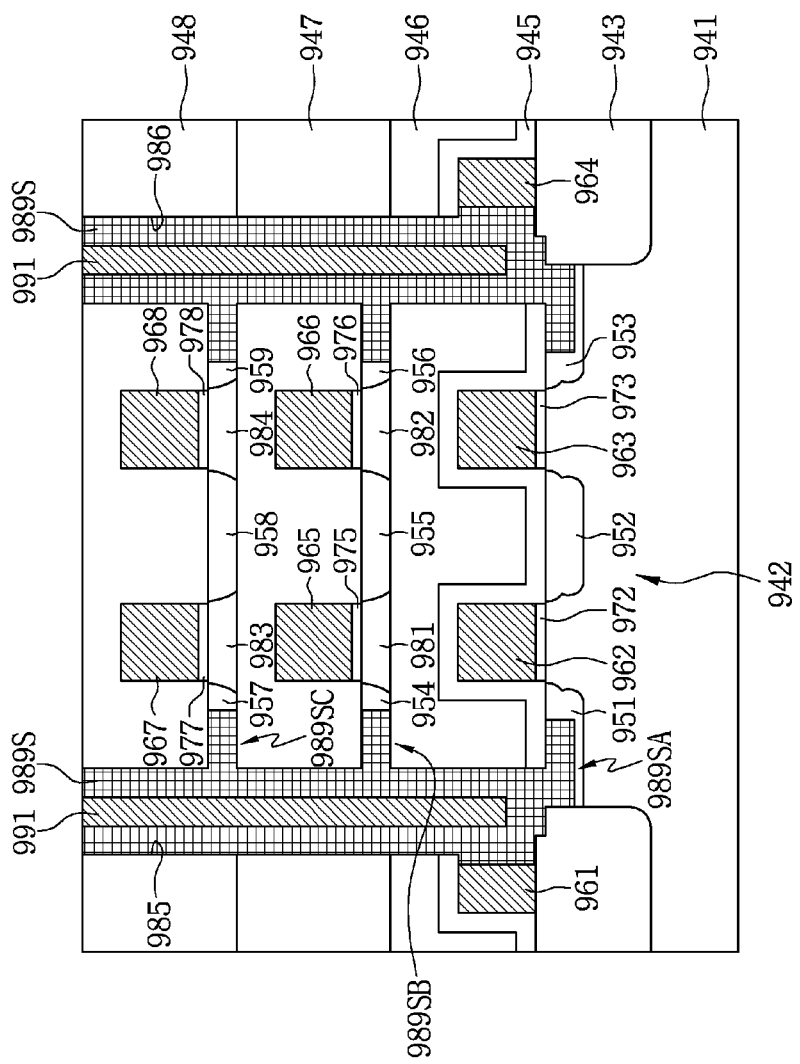

Referring to FIG. 9G, the third insulating layer 948 may be exposed by planarizing the capping layer 993, the metal layer 991 and the metal silicide layer 989S. The metal layer 991 may remain in the first and second contact holes 985 and 986.

Figure 9H:
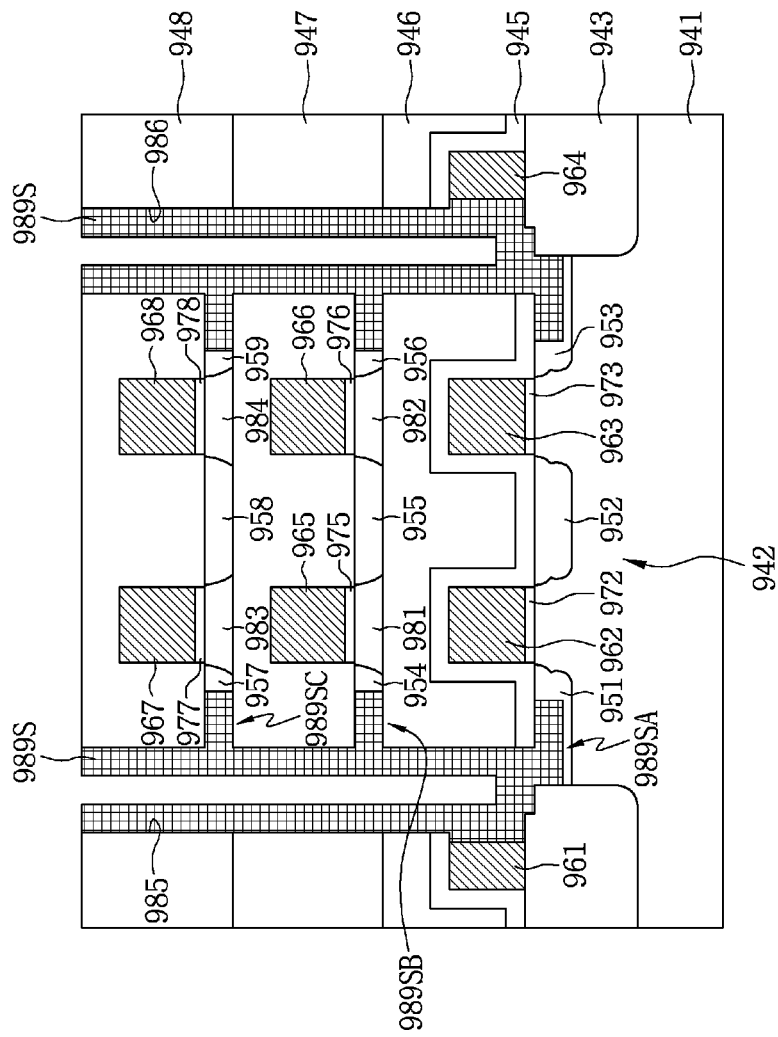

Referring to FIG. 9H, the metal layer 991 may be entirely removed.

Figure 9I:
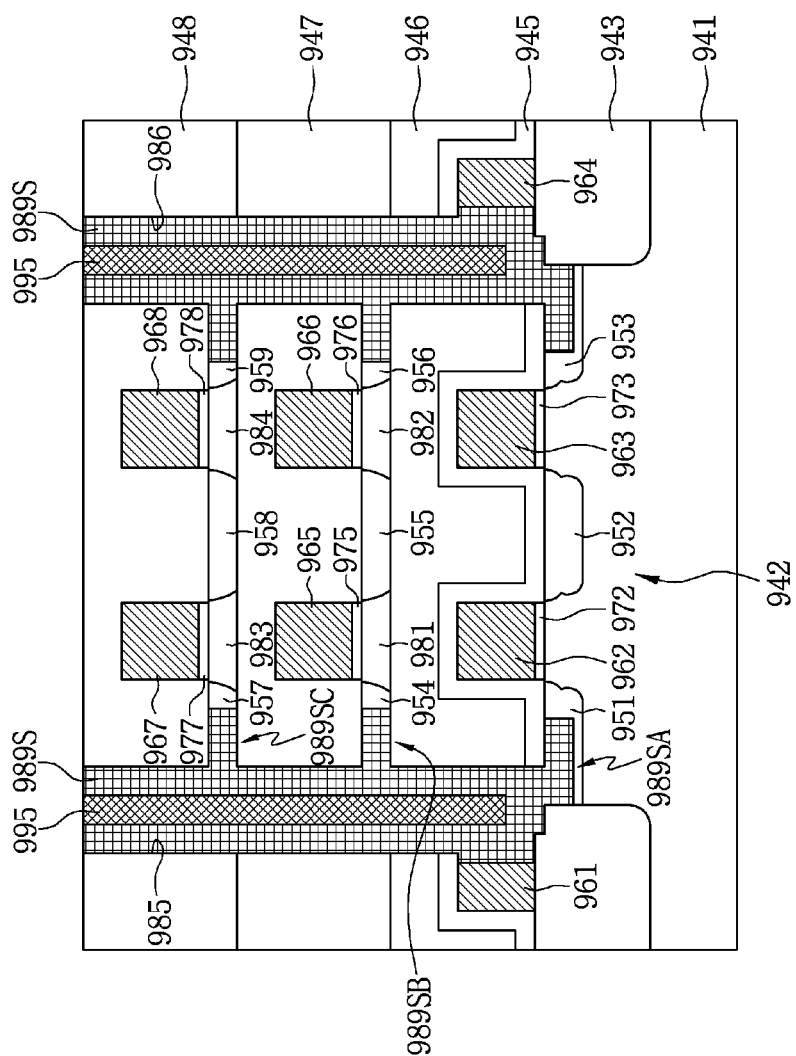

Referring to FIG. 9I, cores 995 may be formed in the first and second contact holes 985 and 986.

Figure 9J:
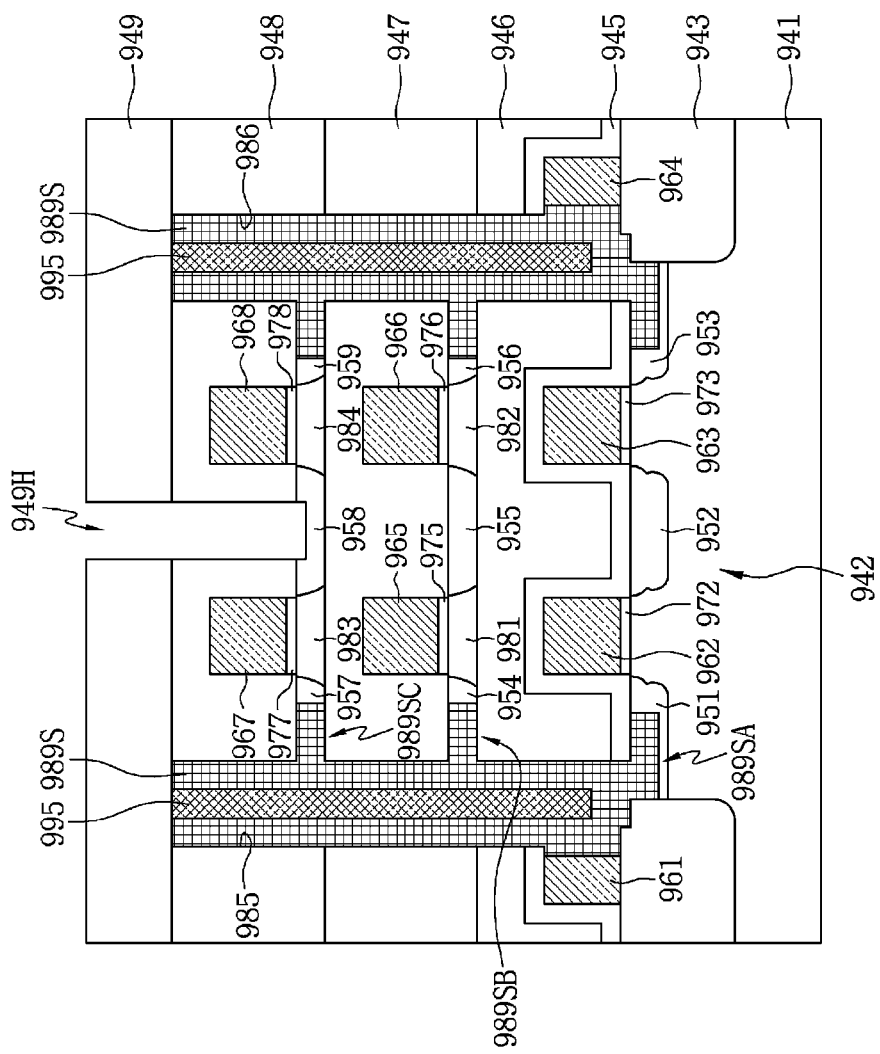

Referring to FIG. 9J, a fourth insulating layer 949 may be formed on the third insulating layer 948. A third hole 949H may be formed which exposes the eighth source/drain region 958 by passing through the fourth insulating layer 949 and the third insulating layer 948.

Figure 9K:
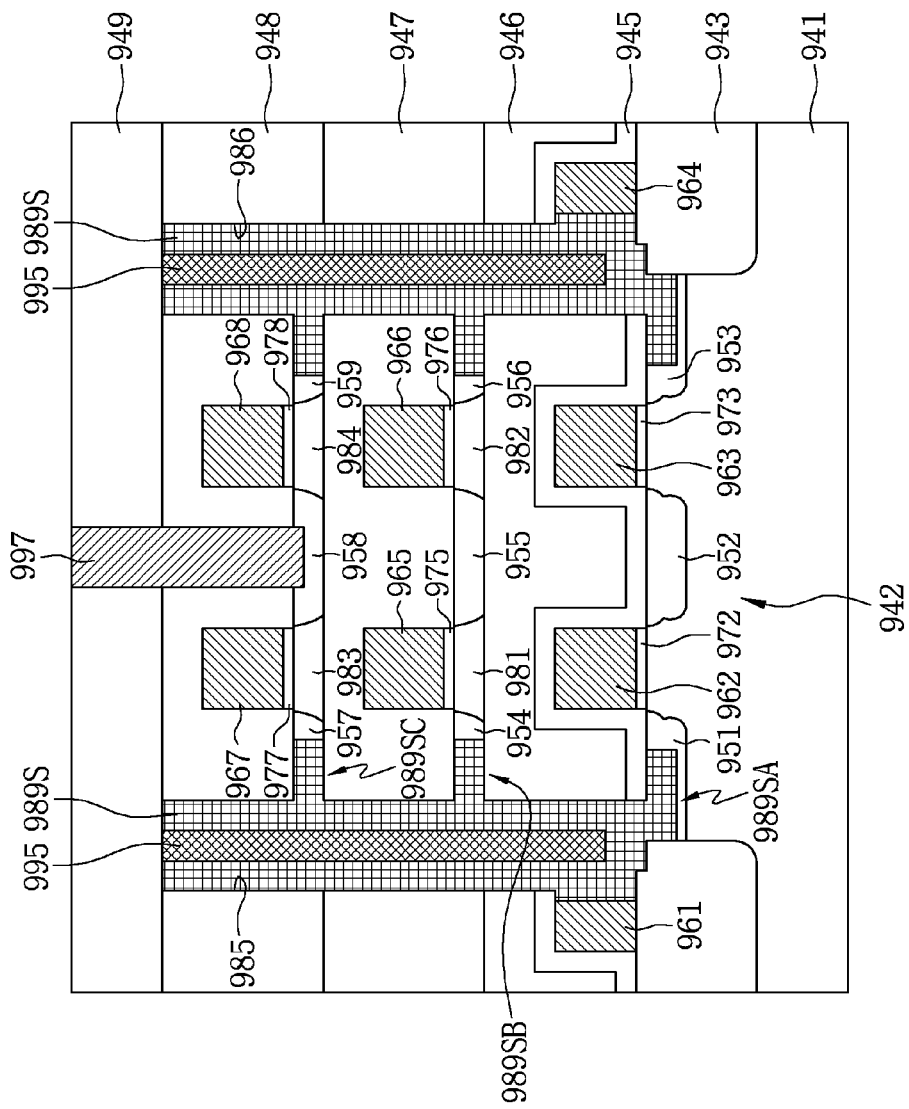

Referring to FIG. 9K, a bit plug 997 may be formed in the third contact hole 49H.

FIGS. 10A to 10D are cross-sectional views of processes for explaining a method of fabricating a semiconductor device in accordance with example embodiments of inventive concepts. A semiconductor device shown in FIGS. 10A to 10D may be portions of a cell region and a peripheral circuit region of a NAND flash memory.

Figure 10A:
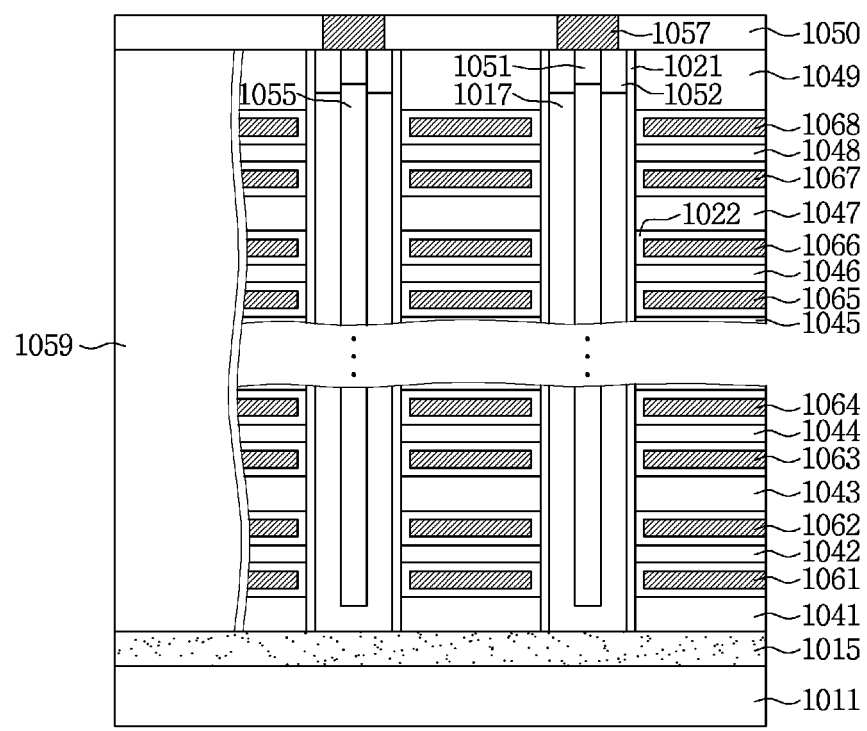
FIGS. 10A to 10D are cross-sectional views that illustrate a method of fabricating a semiconductor device according to example embodiments of inventive concepts.

Referring to FIG. 10A, a sacrificial pattern 1015, first to tenth insulating layers 1041 to 1050, first and second ground selection gate electrodes 1061 and 1062, first to fourth control gate electrodes 1063 to 1066, first and second string selection gate electrodes 1067 and 1068, first and second charge trap dielectric layers 1021 and 1022, bodies 1017, conductive plugs 1051, drain regions 1052, insulating cores 1055, bit lines 1057, and an eleventh insulating layer 1059 may be formed on a semiconductor substrate 1011.

The semiconductor substrate 1011 may include single crystalline silicon and may have P-type impurities, the sacrificial pattern 1015 may include SiGe, and the bodies 1017 may include poly-silicon or single crystalline silicon. The first and second ground selection gate electrodes 1061 and 1062, first to fourth control gate electrodes 1063 to 1066, and first and second string selection gate electrodes 1067 and 1068 may include a conductor such as a metal, metal silicide, metal nitride, poly-silicon, or a combination of thereof. The first and second charge trap dielectric layers 1021 and 1022 may include silicon oxide, silicon nitride, silicon oxynitride, metal oxide, metal silicate, or a combination of thereof. For example, the first charge trap dielectric layer 1021 may include a structure in which a first silicon oxide, silicon nitride, and second silicon oxide are in turn stacked, and the second charge trap dielectric layer 1022 may include AlO.

Figure 10B:
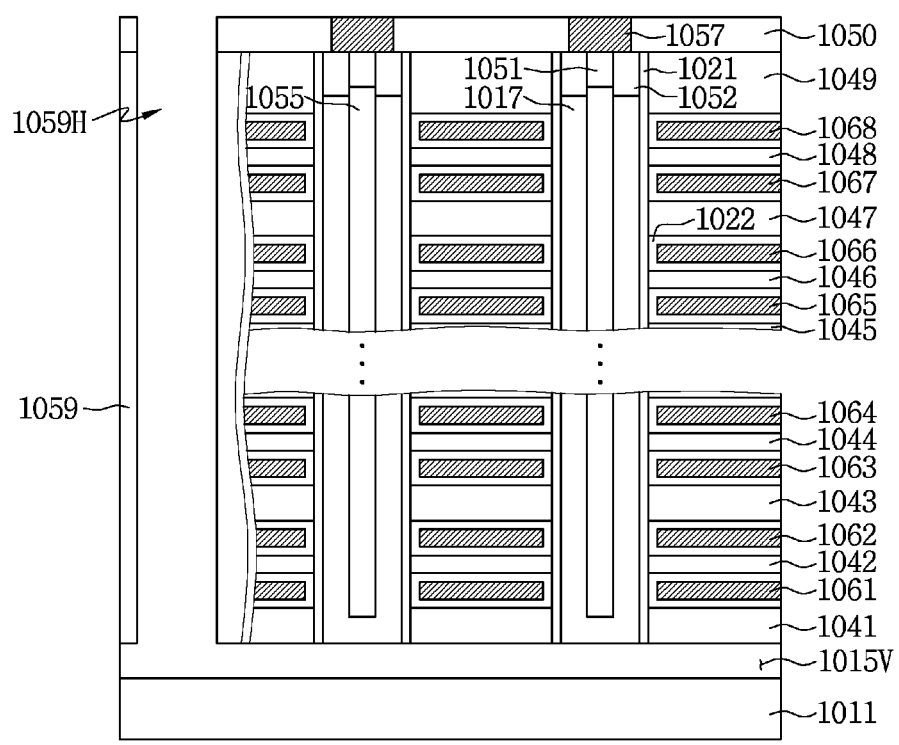

Referring to FIG. 10B, a contact hole 1059H that passes through the tenth insulating layer 1050 and eleventh insulating layer 1059 is formed and a void space 1015V may be formed by removing the eleventh insulating layer 1059 and a sacrificial pattern 1015. The semiconductor substrate 1011 and the body 1017 may be exposed in the void space 1015V.

Figure 10C:
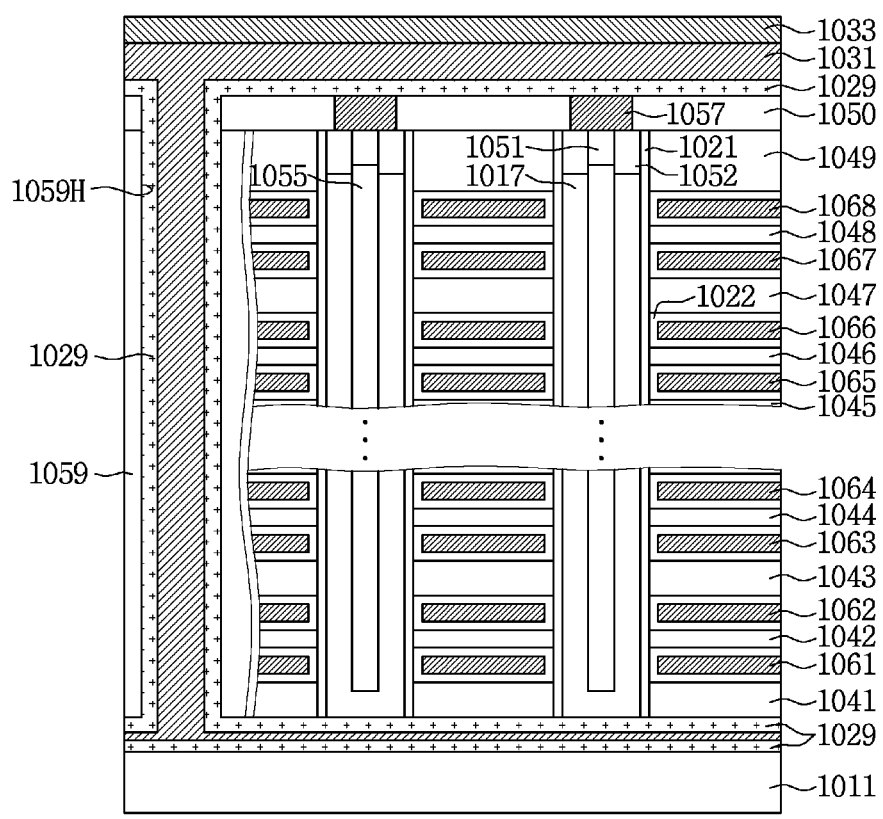

Referring to FIG. 10C, an amorphous silicon layer 1029 may be formed in the contact hole 1059H and the void space 1015V. A metal layer 1031 and a capping layer 1033 may in turn be formed on the amorphous silicon layer 1029.

Figure 10D:
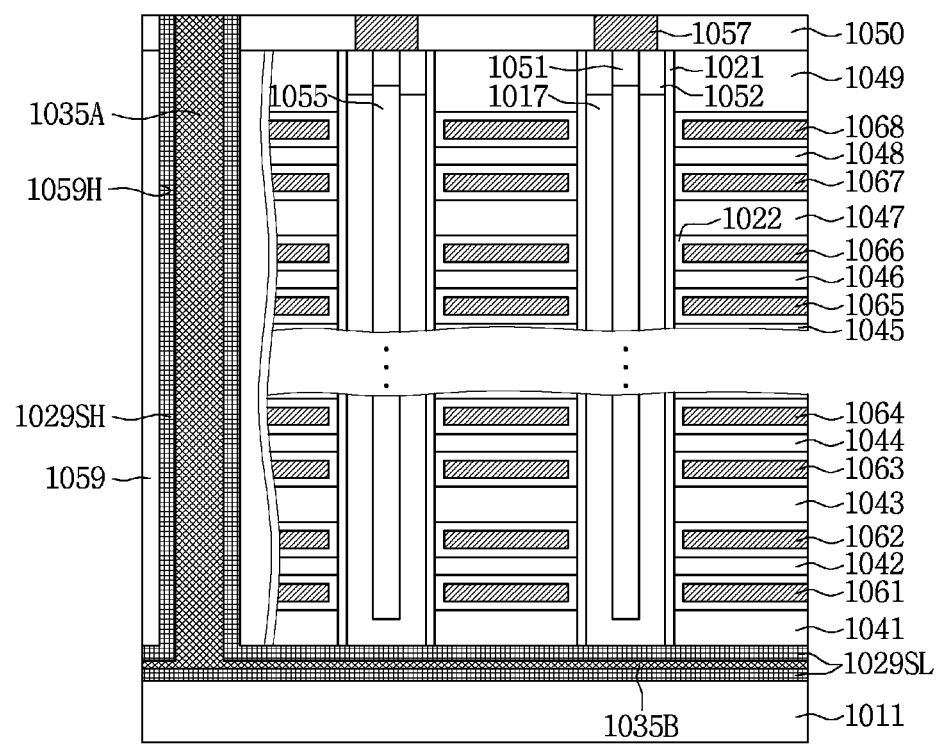

Referring to FIG. 10D, a metal silicide layer 1029SH and 229SL may be formed using a silicide transforming process. The metal silicide layer 1029SH and 1029SL may include a metal silicide plug 1029SH and a metal silicide pattern 1029SL. The metal silicide pattern 1029SL may be in contact with the semiconductor substrate 1011 and the body 1017. A core 1035A and 1035B may be formed by removing the metal layer 1031 and the capping layer 1033. The core 1035A and 1035B may include a core plug 1035A and a core pattern 1035B.

Figure 11:
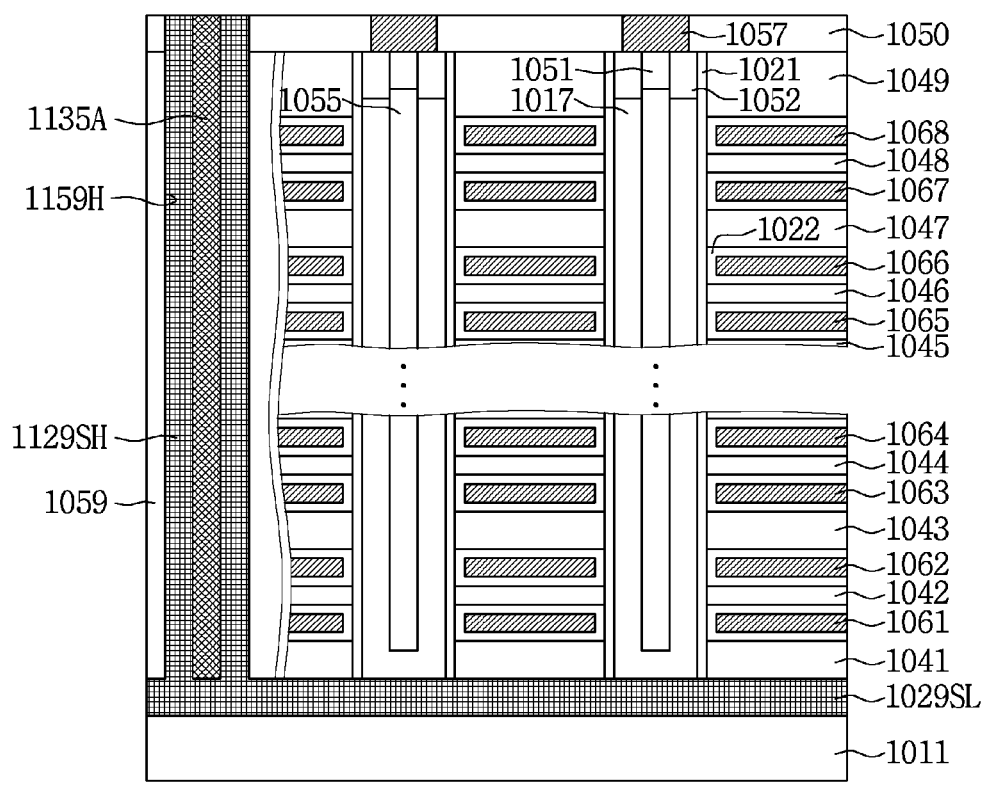
FIG. 11 is a cross-sectional view of a process for explaining a method of fabricating a semiconductor device in accordance with an embodiment of the inventive concepts.

FIG. 11 is a cross-sectional view of a process for explaining a method of fabricating a semiconductor device in accordance with example embodiments of inventive concepts.

Referring to FIG. 11, a core plug 1135A may be formed in a contact hole 1159H. The metal silicide plug 1129SH may surround a side surface of the core plug 1135A. A metal silicide pattern 1129SL may be formed which is in continuity with a lower end of the metal silicide plug 1129SH.

Figure 12A:
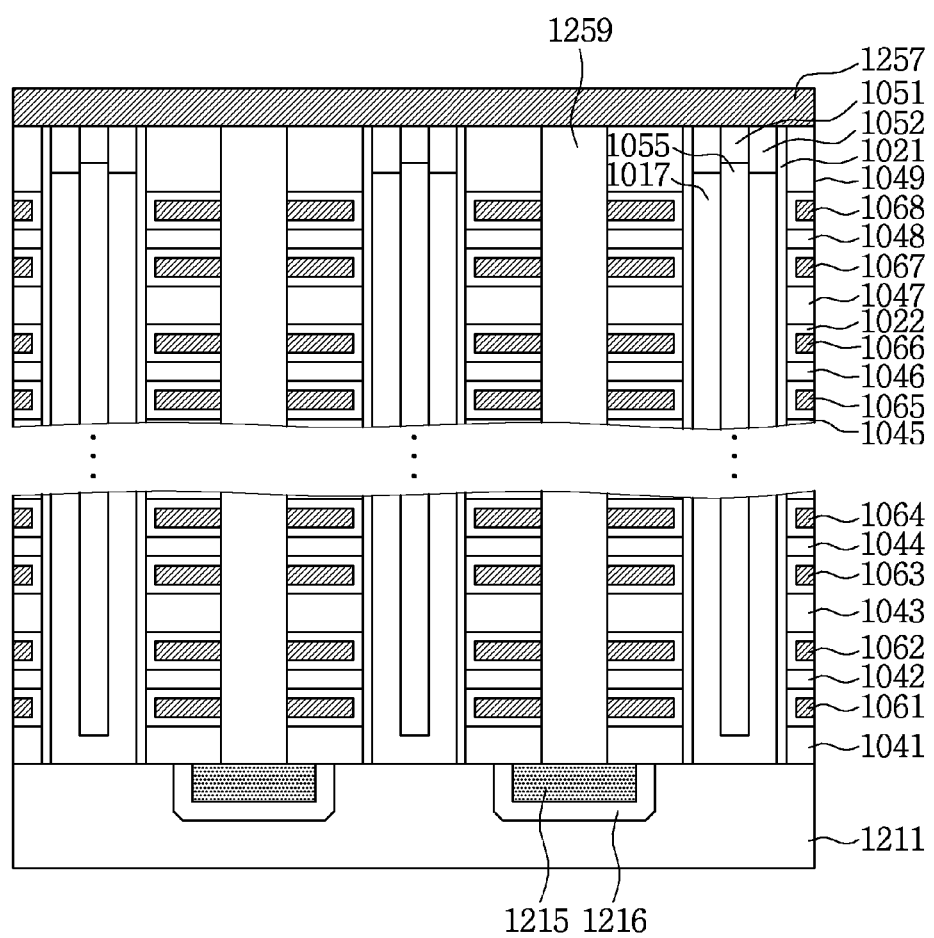
FIGS. 12A to 12B are cross-sectional views that illustrate a method of fabricating a semiconductor device according to example embodiments of inventive concepts.
Figure 12B:
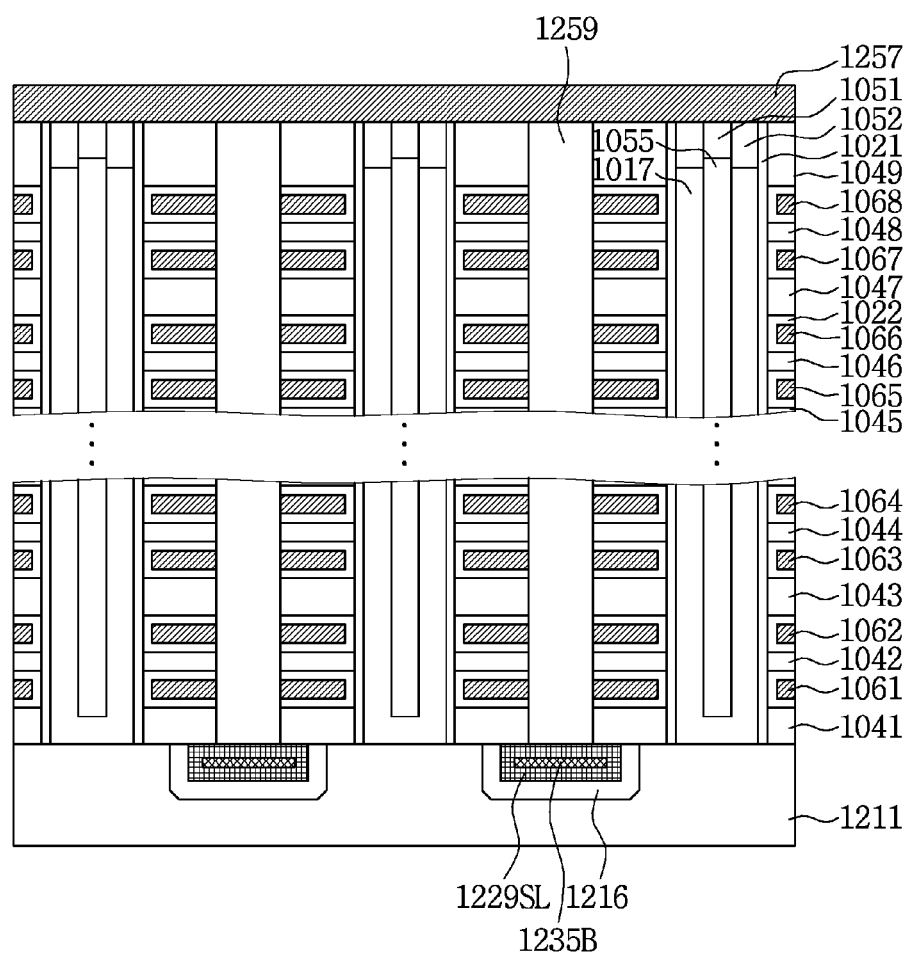

FIGS. 12A and 12B are cross-sectional views of processes for explaining a method of fabricating a semiconductor device in accordance with example embodiments of inventive concepts.

Referring to FIG. 12A, source regions 1216 may be formed on the semiconductor substrate 1211. The semiconductor substrate 1211 may include single crystalline silicon and may have P-type impurities. A sacrificial pattern 1215 may be formed on the source regions 1216. Eleventh insulating layers 1259 may be formed on the sacrificial patterns 1215. Bodies 1017 may be in contact with the semiconductor substrate 1211. The source regions 1216 may include single crystalline silicon having N-type impurities. One or more bit lines 1257 may be formed on the eleventh insulating layers 1259 and the bitlines may connect to conductive plugs 1052 and drain regions 1051 on the bodies 1017.

Referring to FIG. 12B, metal silicide patterns 1229SL and core patterns 1235B may be formed after the sacrificial patterns 1215 are removed. The metal silicide patterns 1229SL may surround the core patterns 1235B. The metal silicide patterns 1229SL may be formed in the source regions 1216. The metal silicide patterns 1229SL may be in contact with the source regions 1216.

FIGS. 13A to 13D are cross-sectional views of processes for explaining a method of fabricating a semiconductor device in accordance with example embodiments of inventive concepts. A semiconductor device shown in FIGS. 13A to 13B may be portions of a cell region and a peripheral circuit region of a phase change memory.

Figure 13A:
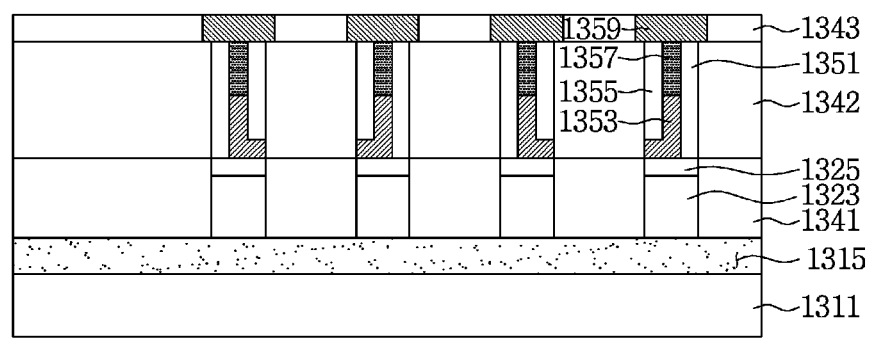
FIGS. 13A to 13D are cross-sectional views that illustrate a method of fabricating a semiconductor device according to example embodiments of inventive concepts.

Referring to FIG. 13A, a sacrificial pattern 1315, first to third insulating layers 1341 to 1343, switching devices 1323, switching electrodes 1325, lower electrodes 1353, spacers 1351, 1355, data storage elements 1357 and upper electrodes 1359 may be formed on a semiconductor substrate 1311. The semiconductor substrate 1311 may include single crystalline silicon having P-type impurities. The sacrificial pattern 1315 may include SiGe.

The switching devices 1323 may include diodes. Each of the switching devices 1323 may include single crystalline silicon having P-type impurities. The switching electrodes 1325 may include conductors such as metal silicide, metal nitride, a metal, or a combination of thereof. The data storage elements 1357 may include phase-change materials such as GeSbTe (GST), but example embodiments are not limited thereto.

Figure 13B:
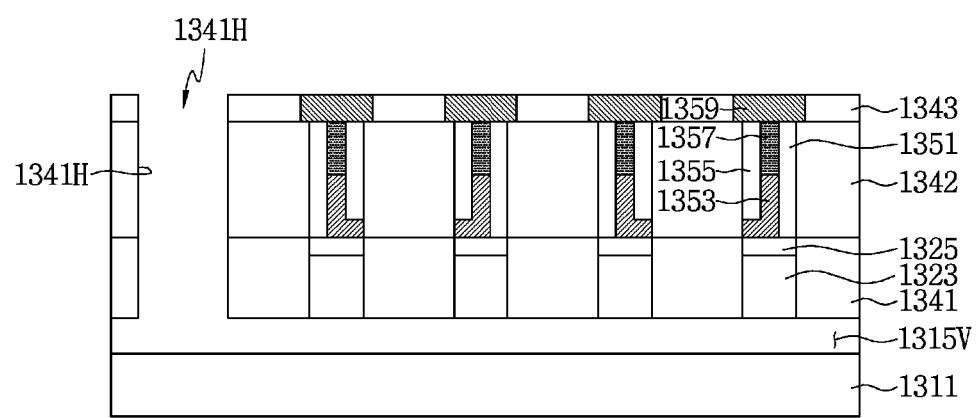

Referring to FIG. 13B, a contact hole 1341H that passes through the first to third insulating layers 1341 to 1343 may be formed and a void space 1315V may be formed by removing a sacrificial pattern 1315.

Figure 13C:
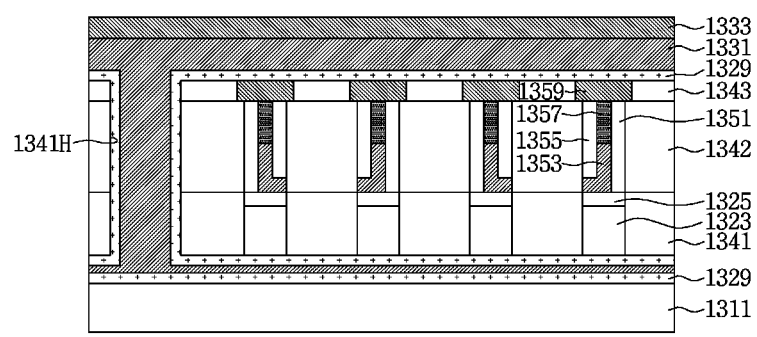

Referring to FIG. 13C, an amorphous silicon layer 1329, a metal layer 1331 and a capping layer 1333 may be formed in the contact hole 1341H and the void space 1315V.

Figure 13D:
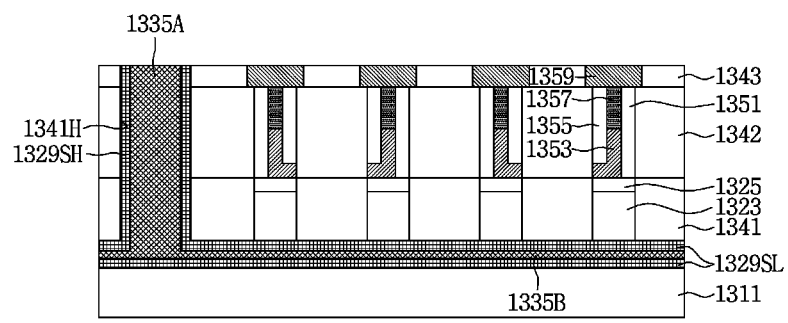

Referring to FIG. 13D, a metal silicide layer 1329SH and 1329SL may be formed using a silicide transforming process. The metal silicide layer 1329SH and 1329SL may include a metal silicide plug 1329SH and a metal silicide pattern 1329SL. The metal silicide pattern 1329SL may be in contact with the semiconductor substrate 311 and the switching devices 1323. A core 1335A and 1335B may be formed after the metal layer 1331 and the capping layer 1333 are removed. The core 1335A and 1335B may include a core plug 1335A and a core pattern 1335B. The core 1335A may include W, WN, TiN, TaN, Ru, or a combination thereof. However, example embodiments are not limited thereto.

Figure 14:
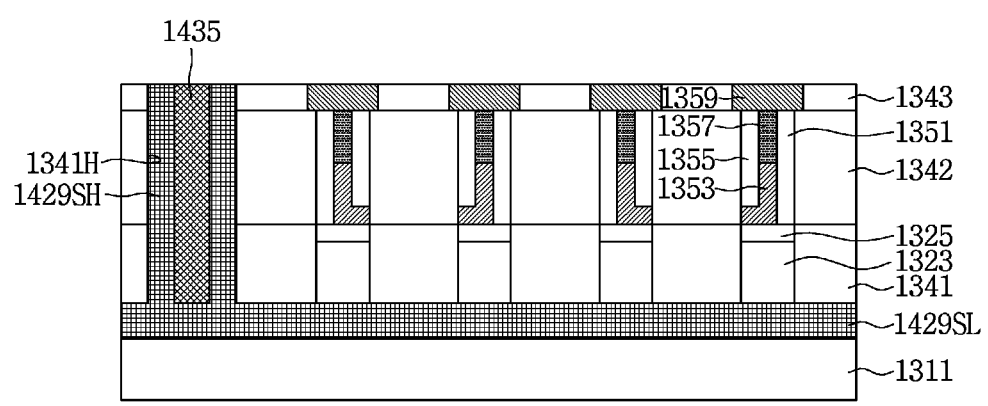
FIG. 14 is a cross-sectional view of a process for explaining a method of fabricating a semiconductor device in accordance with an embodiment of the inventive concepts.

FIG. 14 is a cross-sectional view of a process for explaining a method of fabricating a semiconductor device in accordance with example embodiments of inventive concepts.

Referring to FIG. 14, a core plug 1435 may be formed in a contact hole 1341H. The metal silicide plug 1329SH may surround a side surface of the core plug 1435. A metal silicide pattern 1429SL may be formed which is in continuity with a lower end of the metal silicide plug 1429SH. The core 1435 may include W, WN, TiN, TaN, Ru, or a combination thereof. However, example embodiments are not limited thereto.

Figure 15:
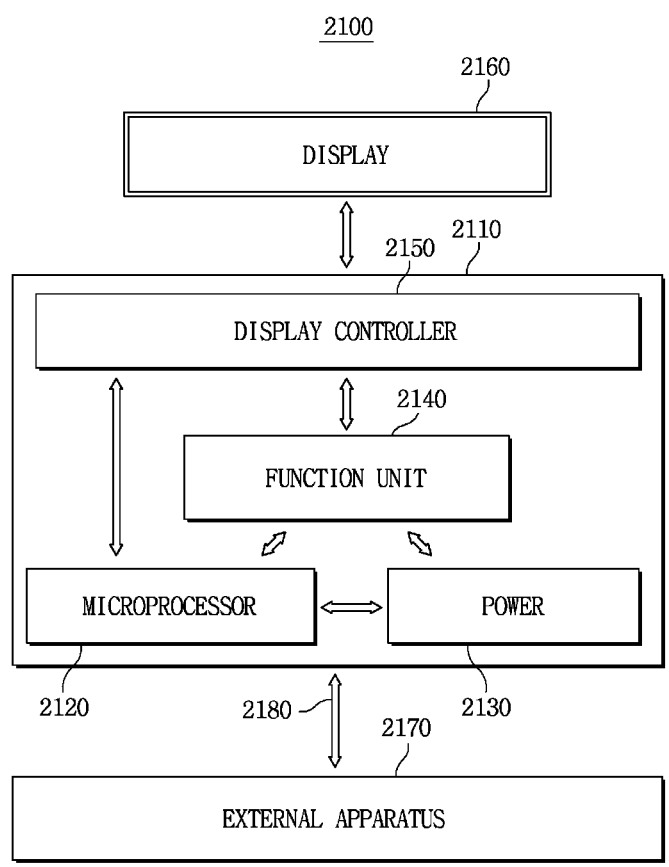
FIGS. 15 and 16 are block diagrams of a system for explaining electronic devices in accordance with applications of example embodiments of inventive concepts.

FIG. 15 is a block diagram of a system for explaining an electronic device in accordance with application example embodiments of inventive concepts.

Referring to FIG. 15, a semiconductor device that is the same (and/or similar) to that described with reference to FIGS. 2A to 2H, 3A to 3E, 4A to 4F, 5A to 5C, 6A to 6B, 7, 8, 9A to 9K, 10A to 10D, 11, 12A to 12B, 13A to 13D, and 14 may be applied to an electronic system 2100. The electronic system 2100 may include a body 2110, a microprocessor unit 2120, a power unit 2130, a function unit 2140, and a display controller unit 2150. The body 2110 may be a mother board formed by a printed circuit board (PCB). The microprocessor unit 2120, the power unit 2130, the function unit 2140, and the display controller unit 2150 may be mounted on the body 2110. The display unit 2160 may be disposed inside or outside the body 2110. For example, the display unit 2160 may be disposed on a surface of the body 2110 to display images processed by the display controller unit 2150.

The power unit 2130 may function to receive a constant voltage from an external battery (not shown), and divide the received voltage into required voltages levels to supply the microprocessor unit 2120, the function unit 2140, the display controller unit 2150, etc. The microprocessor unit 2120 may receive a voltage from the power unit 2130 to then control the function unit 2140 and the display controller unit 2160. The function unit 2140 may perform various functions of the electronic system 2100. For example, in a case where the electronic system 2100 is a portable phone, the function unit 2140 may include various components which can perform portable functions such as dialing, outputting video to the display unit 2160 and outputting audio to a speaker, in communication with an external apparatus 2170, and the like. And, when a camera is installed, the function unit 2140 may function as a camera image processor.

In a case where the electronic system 2100 is connected with a memory card or the like, in order to expand capacity, the function unit 2140 may be a memory card controller. The function unit 2140 may transmit/receive signals to/from the external apparatus 2170 through a wired or wireless communication unit 2180. Further, in a case where the electronic system 2100 needs a universal serial bus (USB) in order to expand function, the function unit 2140 may function as an interface controller. Furthermore, the function unit 2140 may include a mass storage device.

The semiconductor device similar to that described with reference to FIGS. 2A to 2H, 3A to 3E, 4A to 4F, 5A to 5C, 6A to 6B, 7, 8, 9A to 9K, 10A to 10D, 11, 12A to 12B, 13A to 13D, and 14 may be applied to the function unit 2140 or the microprocessor unit 2120. For example, the function unit 2140 may include the metal silicide layer 29SH and 29SL. The function unit 2140 may have an advantage in high-integration and exhibit superior electrical characteristics than the related art due to the metal silicide layer 29SH and 29SL. Accordingly, the electrical characteristics of the electronic system 2100 may be considerably improved compared to the related art.

Figure 16:
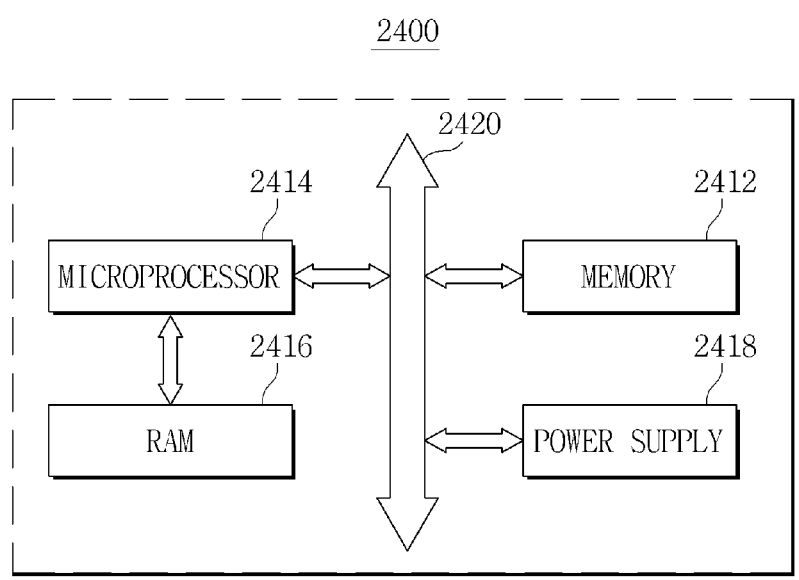

FIG. 16 is a block diagram schematically illustrating another electronic system 2400 including at least one of semiconductor devices in accordance with application example embodiments of inventive concepts.

Referring to FIG. 16, the electronic system 2400 may include at least one of semiconductor devices in accordance with various example embodiments of inventive concepts. The electronic system 2400 may be used to manufacture a mobile device or computer. For example, the electronic system 2400 may include a memory system 2412, a microprocessor unit 2414, a RAM 2416 and a power supply device 2418. The microprocessor unit 2414 may program and control the electronic system 2400. The RAM 2416 may be used as an operation memory of the microprocessor unit 2414. The microprocessor unit 2414, the RAM 2416 and/or other components may be assembled into a single package. The memory system 2412 may store codes for operation of the microprocessor unit 2414, data processed by the microprocessor unit 2414, or external input data. The memory system 2412 may include a controller and a memory.

The semiconductor device similar to that described with reference to FIGS. 2A to 2H, 3A to 3E, 4A to 4F, 5A to 5C, 6A to 6B, 7, 8, 9A to 9K, 10A to 10D, 11, 12A to 12B, 13A to 13D, and 14 may be applied to the microprocessor unit 2414, the RAM 2416, or the memory system 2412. For example, the microprocessor unit 2414 may include a metal silicide layer (e.g., 29SH and 29SL). The microprocessor unit 2414 may have an advantage in high-integration and exhibit superior electrical characteristics than the related art due to the metal silicide layer 29SH and 29SL. Accordingly, the electrical characteristics of the electronic system 2400 may be considerably superior to the related art.

In accordance with example embodiments of inventive concepts, a sacrificial pattern may be formed on a semiconductor substrate. After active elements are formed on the sacrificial pattern, the sacrificial pattern may be removed, and amorphous silicon may be buried. And then, the amorphous silicon may be transformed into a metal silicide layer using a silicide transforming process. The metal silicide layer exhibits a lower electrical resistance than doped silicon. The metal silicide layer may be used as a buried wiring. Example embodiments of inventive concepts provide a method of fabricating a semiconductor device and related device in which contamination of the active elements can be reduced (and/or prevented) and buried wirings having excellent electrical characteristics can be formed. Therefore, in accordance with the example embodiments of inventive concepts, a semiconductor device can be implemented which is favorable to highly integrate and has excellent electrical characteristics.

The foregoing is illustrative of embodiments and is not to be construed as limiting thereof. While some example embodiments have been particularly shown and described, it will be understood by one of ordinary skill in the art that variations in form and detail may be made therein without departing from the spirit and scope of the claims.

What is claimed is:

1. A method of fabricating a semiconductor device, comprising:
    forming a sacrificial pattern having SiGe on a substrate, the substrate having crystalline silicon;
    forming a body on the sacrificial pattern, the body having crystalline silicon;
    forming at least one active element on the body;
    forming an insulating layer that covers the sacrificial pattern, the body and the at least one active element;
    forming a contact hole to expose the sacrificial pattern through the insulating layer;
    forming a void space by removing the sacrificial pattern;
    forming an amorphous silicon layer in the contact hole and the void space; and
    transforming the amorphous silicon layer into a metal silicide layer.

2. The method according to claim 1, wherein
    the forming the sacrificial pattern includes performing a first epitaxial growth process, and
    the forming the body includes performing a second epitaxial growth process.

3. The method according to claim 1, wherein the sacrificial pattern directly contacts the substrate and the body.

4. The method according to claim 1, wherein the substrate and the body include P-type impurities.

5. The method according to claim 1, wherein
    the amorphous silicon layer directly contacts the substrate and the body, and
    the metal silicide layer directly contacts the substrate and the body.

6. The method according to claim 1, further comprising:
    forming a core that is surrounded by the metal silicide layer.

7. The method according to claim 6, wherein
    the core is formed in the contact hole, and
    the metal silicide layer fills the void space and surrounds side surfaces of the core.

8. The method according to claim 6, wherein
    the core is formed in the void space and the contact hole, and
    the metal silicide layer surrounds a surface of the core.

9. The method according to claim 1, further comprising:
    forming a conductive plug in the contact hole and on the metal silicide layer, wherein the conductive plug contacts the metal silicide layer.

10. The method according to claim 1, wherein the transforming the amorphous silicon layer into the metal silicide layer includes:
    forming a metal layer that contacts the amorphous silicon layer, and
    heat-treating the metal layer and the amorphous silicon layer.

11. The method according to claim 10, wherein the forming the at least one active element includes:
    forming a gate dielectric layer on the body before the forming the metal layer, and
    forming a gate electrode on the gate dielectric layer.

12. A method of fabricating a semiconductor device, comprising:
    forming a sacrificial pattern on a substrate;
    forming an active element on the sacrificial pattern;
    forming an insulating layer that covers the sacrificial pattern and the active element;
    forming a contact hole to expose the sacrificial pattern through the insulating layer;
    forming a void space by removing the sacrificial pattern;
    forming an amorphous silicon layer in the contact hole and the void space;
    transforming the amorphous silicon layer into a metal silicide layer; and
    forming a conductive pattern on the metal silicide layer.

13. The method according to claim 12, wherein the forming the metal silicide layer and the forming the conductive pattern includes;
    exposing an upper end region of the contact hole by etching-back the amorphous silicon layer;
    forming a metal layer in the upper end region of the contact hole;
    forming the metal silicide layer by heat-treating the metal layer and the amorphous silicon layer;

exposing the upper end region of the contact hole by removing the metal layer; and forming the conductive pattern in the upper end region of the contact hole.

14. The method according to claim 12, wherein forming the metal silicide layer and the conductive pattern includes;

forming the amorphous silicon layer to cover side walls of the contact hole and fill the void space;

forming a metal layer on the amorphous silicon layer;

forming the metal silicide layer by heat-treating the metal layer and the amorphous silicon layer;

removing the metal layer; and forming the conductive pattern on the metal silicide layer, wherein the conductive pattern is formed in the contact hole, the metal silicide layer is formed to fill the void space, and the metal silicide layer is formed to surround side surfaces of the conductive pattern.

15. The method according to claim 12, wherein forming the metal silicide layer and the conductive pattern includes:

forming the amorphous silicon layer on side walls of the contact hole and inner walls of the void space;

forming a metal layer on the amorphous silicon layer;

forming the metal silicide layer by heat-treating the metal layer and the amorphous silicon layer;

removing the metal layer; and forming the conductive pattern on the metal silicide layer, wherein the conductive pattern is formed in the contact hole and the void space, and the metal silicide layer is formed to surround the conductive pattern.

16. A method of fabricating a semiconductor device, comprising:

forming a sacrificial pattern on a substrate;

forming a stacked structure including at least one active element on the sacrificial pattern, the stacked structure defining at least one contact hole that exposes the sacrificial pattern;

removing the sacrificial pattern to form a void pattern between the substrate and the stacked structure;

forming an amorphous silicon layer in the at least one contact hole and the void pattern, the amorphous silicon layer partially filling at least one of the at least one contact hole and the void pattern;

transforming the amorphous silicon layer into a metal silicide layer;

forming a conductive pattern on the metal silicide layer; and forming a conductive plug in at least one of the at least one contact hole and the void pattern after the transforming the amorphous silicon layer into the metal silicide layer.

17. The method of claim 16, wherein a part of the metal silicide layer surrounds a part of the conductive plug.

18. The method claim 16, wherein a lowermost surface of the conductive plug is on an uppermost surface of the metal silicide layer.

19. The method of claim 16, wherein the transforming the amorphous silicon layer into the metal silicide layer includes:

forming a metal layer that contacts the amorphous silicon layer, and heat-treating the metal layer and the amorphous silicon layer.

* * * * *